(12) United States Patent
Huang

(10) Patent No.: US 12,278,153 B2
(45) Date of Patent: Apr. 15, 2025

(54) SEMICONDUCTOR DEVICE WITH CUSHION STRUCTURE AND METHOD FOR FABRICATING THE SAME

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 100 days.

(21) Appl. No.: 18/208,466

(22) Filed: Jun. 12, 2023

(65) Prior Publication Data

US 2024/0047287 A1     Feb. 8, 2024

Related U.S. Application Data

(62) Division of application No. 17/882,541, filed on Aug. 6, 2022.

(51) Int. Cl.
*H01L 23/18* (2006.01)
*H01L 21/768* (2006.01)
*H01L 23/522* (2006.01)

(52) U.S. Cl.
CPC ........ *H01L 23/18* (2013.01); *H01L 21/76837* (2013.01); *H01L 23/5226* (2013.01)

(58) Field of Classification Search
CPC .. H01L 23/5329–53295; H01L 21/768–76898
See application file for complete search history.

(56) References Cited

U.S. PATENT DOCUMENTS

| 6,100,194 A * | 8/2000 | Chan ................. H01L 21/76873 |
| | | 257/E21.585 |
| 2002/0127849 A1* | 9/2002 | Lin .................... H01L 21/76843 |
| | | 438/638 |
| 2004/0018722 A1* | 1/2004 | Tarumi .............. H01L 21/76807 |
| | | 438/638 |
| 2004/0101663 A1* | 5/2004 | Agarwala ........... H01L 23/5226 |
| | | 428/209 |
| 2004/0195670 A1* | 10/2004 | Landis ................. H01L 23/522 |
| | | 257/E23.142 |

(Continued)

OTHER PUBLICATIONS

Office Action and and the search report mailed on Nov. 20, 2024 related to U.S. Appl. No. 17/882,541, wherein this application is a DIV of U.S. Appl. No. 17/882,541.

*Primary Examiner* — Kevin Parendo
(74) *Attorney, Agent, or Firm* — Xuan Zhang

(57) ABSTRACT

The present application discloses a semiconductor device and a method for fabricating the semiconductor device. The semiconductor device includes a substrate including a circuit area and a non-circuit area; a top dielectric layer positioned on the substrate; a top interconnector positioned along top dielectric layer and above the circuit area; a cushion structure positioned along the top dielectric layer and above the non-circuit area; a bottom passivation layer positioned on the top dielectric layer; a top conductive pad positioned in the bottom passivation layer and on the top interconnector; a redistribution layer positioned on the top conductive pad, on the bottom passivation layer, and extending from the circuit area to the non-circuit area; and an external connector positioned on the redistribution layer and above the cushion structure. The cushion structure includes a porous polymeric material.

9 Claims, 23 Drawing Sheets

(56) References Cited

U.S. PATENT DOCUMENTS

| | | | |
|---|---|---|---|
| 2005/0280120 A1* | 12/2005 | Tomita | H01L 23/522 257/632 |
| 2006/0091536 A1* | 5/2006 | Huang | H01L 24/48 257/734 |
| 2008/0230874 A1* | 9/2008 | Yamada | H01L 21/78 257/E23.002 |
| 2008/0296768 A1* | 12/2008 | Chebiam | H01L 21/76873 438/650 |
| 2009/0102059 A1* | 4/2009 | Ishii | H01L 23/5226 257/E23.145 |
| 2010/0065954 A1* | 3/2010 | Tu | H01L 25/0655 257/784 |
| 2010/0200991 A1* | 8/2010 | Akolkar | C23C 16/45529 257/E23.161 |
| 2011/0017499 A1* | 1/2011 | Yang | H01L 21/76873 174/257 |
| 2014/0077356 A1* | 3/2014 | Chen | H01L 23/3171 257/737 |
| 2014/0312502 A1* | 10/2014 | Jahnes | H01L 21/76877 257/774 |
| 2014/0327141 A1* | 11/2014 | Yu | H01L 21/76846 257/751 |
| 2015/0050808 A1* | 2/2015 | Kolics | H01L 21/76898 438/675 |
| 2015/0137326 A1 | 5/2015 | Kang et al. | |
| 2015/0206835 A1* | 7/2015 | Lamorey | H01L 21/76883 257/773 |
| 2016/0049384 A1* | 2/2016 | Lu | H01L 21/8221 257/737 |
| 2017/0117218 A1* | 4/2017 | Liu | H01L 21/76844 |
| 2019/0189568 A1* | 6/2019 | Shen | H01L 24/13 |
| 2020/0098619 A1* | 3/2020 | Marieb | C23C 18/48 |
| 2020/0098707 A1* | 3/2020 | Chen | H01L 23/53214 |
| 2021/0036097 A1* | 2/2021 | Tsai | H01L 29/945 |

* cited by examiner

SEMICONDUCTOR DEVICE WITH CUSHION STRUCTURE AND METHOD FOR FABRICATING THE SAME

CROSS-REFERENCE TO RELATED APPLICATION

This application is a divisional application of U.S. Non-Provisional application Ser. No. 17/882,541 filed 6 Aug. 2022, which is incorporated herein by reference in its entirety.

TECHNICAL FIELD

The present disclosure relates to a semiconductor device and a method for fabricating the semiconductor device, and more particularly, to a semiconductor device with a cushion structure and a method for fabricating the semiconductor device with the cushion structure.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate including a circuit area and a non-circuit area; a top dielectric layer positioned on the substrate; a top interconnector positioned along top dielectric layer and above the circuit area; a cushion structure positioned along the top dielectric layer and above the non-circuit area; a bottom passivation layer positioned on the top dielectric layer; a top conductive pad positioned in the bottom passivation layer and on the top interconnector; a redistribution layer positioned on the top conductive pad, on the bottom passivation layer, and extending from the circuit area to the non-circuit area; and an external connector positioned on the redistribution layer and above the cushion structure. The cushion structure includes a porous polymeric material.

Another aspect of the present disclosure provides a semiconductor device including a substrate including a circuit area and a non-circuit area; a top dielectric layer positioned on the substrate; a top interconnector positioned along top dielectric layer and above the circuit area; a cushion structure positioned along the top dielectric layer and above the non-circuit area; a top conductive pad positioned on the top interconnector; a bottom passivation layer including a recessing portion positioned on the top dielectric layer, surrounding the top conductive pad, and covering the cushion structure, and a plurality of protruding portions positioned on the recessing portion, covering a portion of the top conductive pad, and above the circuit area; a redistribution layer positioned on the top conductive pad, covering the plurality of protruding portions, and extending from the circuit area to the non-circuit area to cover a portion of the recessing portion; and an external connector positioned on the redistribution layer and above the cushion structure. The cushion structure includes a porous polymeric material.

Another aspect of the present disclosure provides a method for fabricating a semiconductor device including providing a substrate including a circuit area and a non-circuit area; forming a top dielectric layer on the substrate; forming a top interconnector along the top dielectric layer and above the circuit area; forming a cushion structure along the top dielectric layer and above the non-circuit area; forming a top conductive pad on the top interconnector; forming a bottom passivation layer on the top dielectric layer to surround the top conductive pad and cover the cushion structure; forming a redistribution layer on the top conductive pad, on the bottom passivation layer, and extending from the circuit area to the non-circuit area; and forming an external connector on the redistribution layer and above the cushion structure. The cushion structure includes a porous polymeric material.

In some embodiments, the top interconnector comprises a barrier layer positioned between the filler layer and the isolation layer.

In some embodiments, the top interconnector comprises an adhesive layer positioned between the filler layer and the barrier layer.

In some embodiments, the top interconnector comprises a seed layer positioned between the filler layer and the adhesive layer.

In some embodiments, a top surface of the recessing portion and a top surface of the top conductive pad are at the same vertical level.

In some embodiments, the top cushion layer comprises methylsilsesquioxane.

In some embodiments, a ratio between a thickness of the bottom cushion layer to a thickness of the top cushion layer is between about 0.1 and about 1.5.

In some embodiments, the method further comprises forming a connector barrier layer between the external connector and the redistribution layer.

In some embodiments, the top dielectric layer and the bottom passivation layer comprise the same material.

In some embodiments, the method further comprises forming a top passivation layer on the bottom passivation layer.

In some embodiments, the top passivation layer comprises a polymeric material.

Due to the design of the semiconductor device of the present disclosure, the cushion structure may reduce the stress during the process of forming the external connector. As a result, the delamination (or crack) of the semiconductor device may be reduced. In addition, the top passivation layer formed of polymeric material may be capable of absorbing and distributing the stress to further improve the stress-buffering capability of the semiconductor device.

The foregoing has outlined rather broadly the features and technical advantages of the present disclosure in order that the detailed description of the disclosure that follows may be better understood. Additional features and advantages of the disclosure will be described hereinafter and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
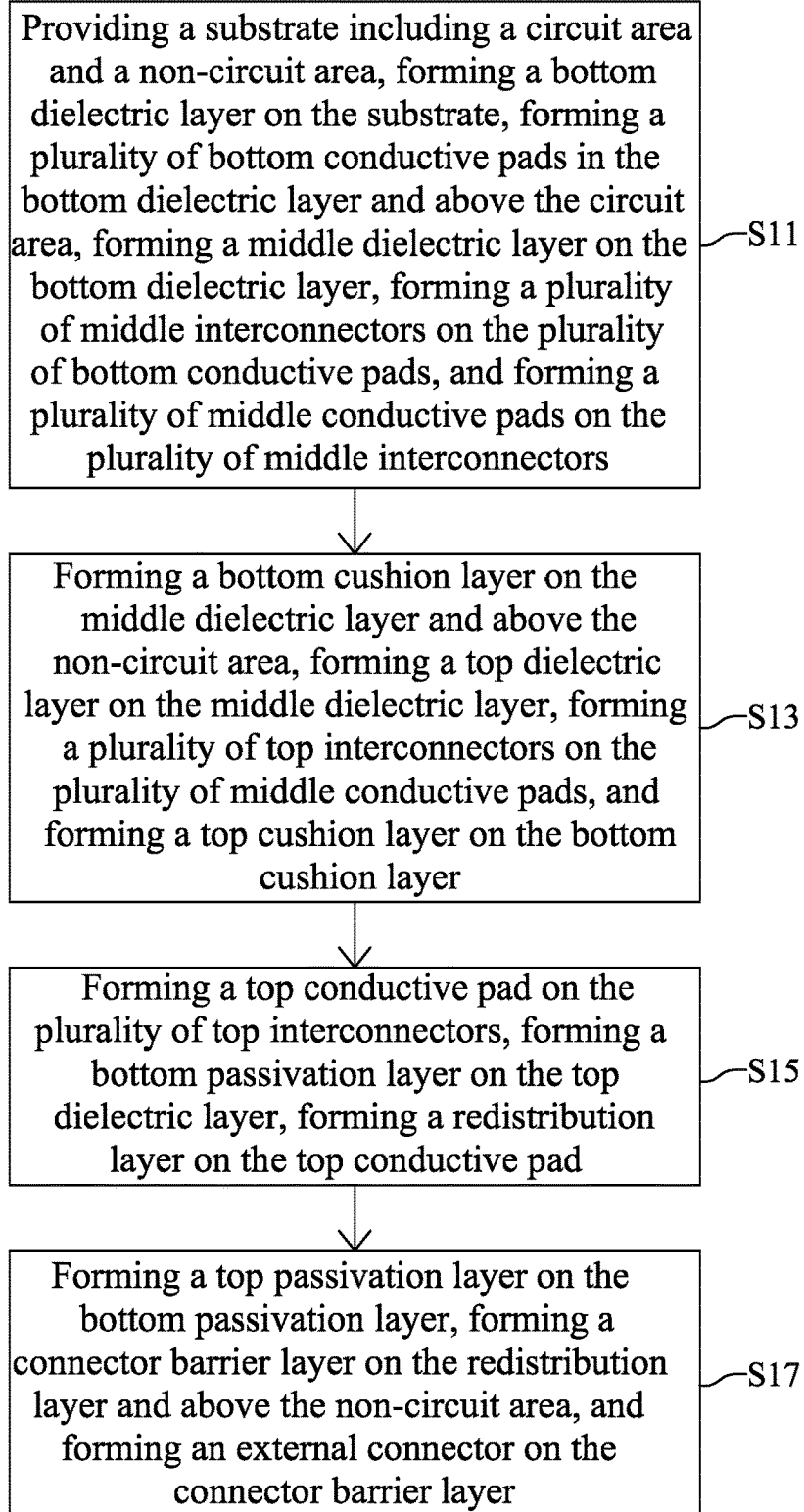
FIG. 1 illustrates, in a flowchart diagram form, a method 10 for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that, in the description of the present disclosure, the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that, in the description of the present disclosure, the functions or steps noted herein may occur in an order different from the order noted in the figures. For example, two figures shown in succession may in fact be executed substantially concurrently or may sometimes be executed in a reversed order, depending upon the functionalities or steps involved.

FIG. 1 illustrates, in a flow chart diagram form, a method 10 for fabricating a semiconductor device 1A in accordance with one embodiment of the present disclosure. FIGS. 2 to 6 illustrate, in schematic cross-sectional view diagrams, part of a flow for fabricating the semiconductor device 1A in accordance with one embodiment of the present disclosure.

Figure 2:
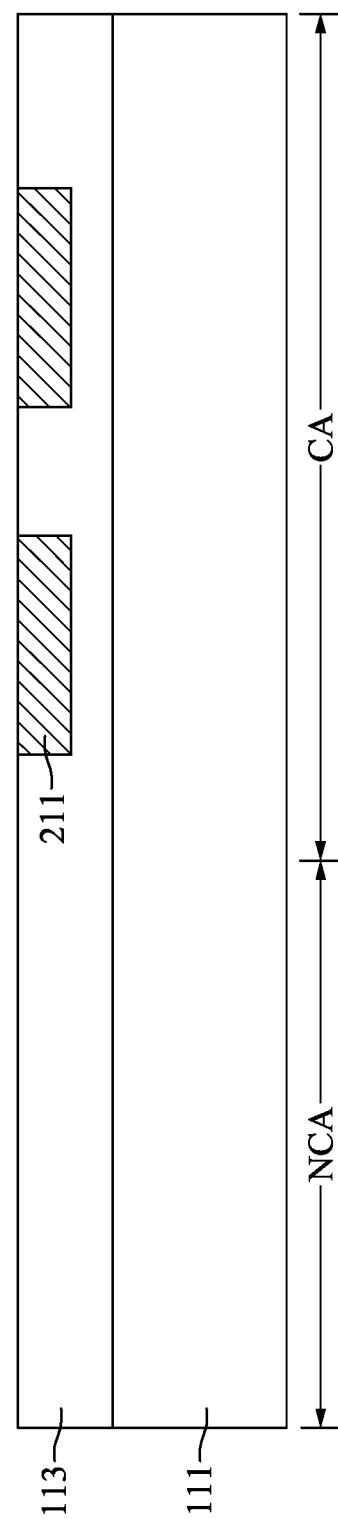
FIGS. 2 to 6 illustrate, in schematic cross-sectional view diagrams, part of a flow for fabricating the semiconductor device in accordance with one embodiment of the present disclosure.
Figure 3:
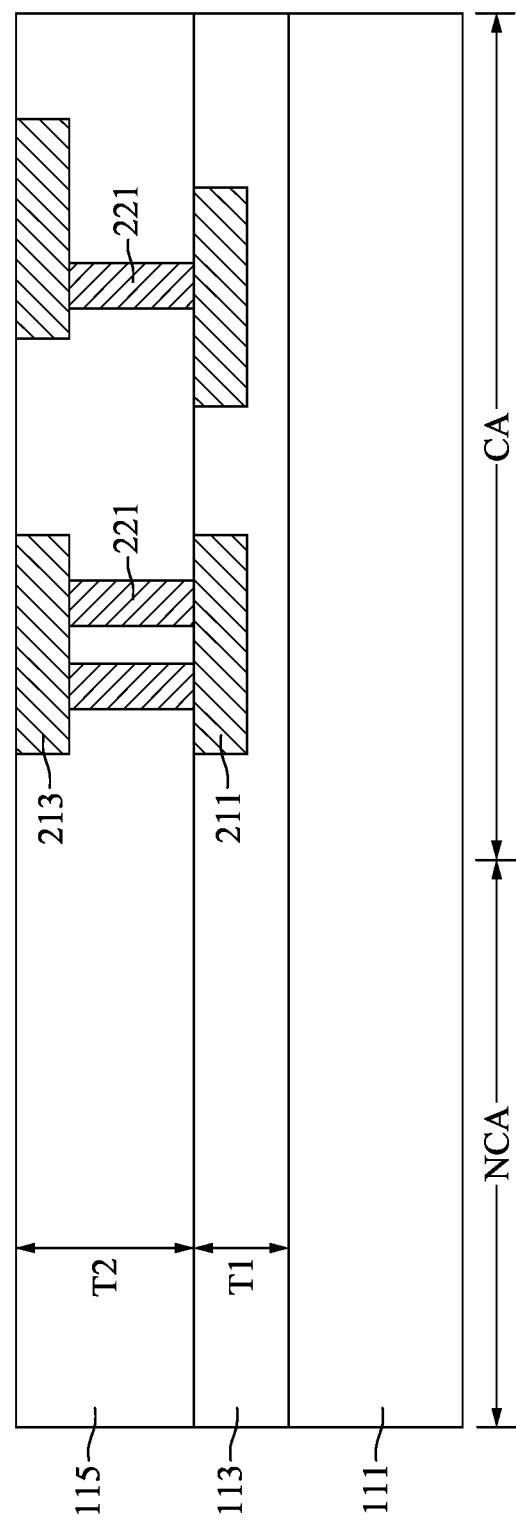

With reference to FIGS. 1 to 3, at step S11, a substrate 111 including a circuit area CA and a non-circuit area NCA may be provided, a bottom dielectric layer 113 may be formed on the substrate 111, a plurality of bottom conductive pads 211 may be formed in the bottom dielectric layer 113 and above the circuit area CA, a middle dielectric layer 115 may be formed on the bottom dielectric layer 113, a plurality of middle interconnectors 221 may be formed on the plurality of bottom conductive pads 211, and a plurality of middle conductive pads 213 may be formed on the plurality of middle interconnectors 221.

With reference to FIG. 2, in some embodiments, the non-circuit area NCA may be next to the circuit area CA. It should be noted that, in the description of the present disclosure, the circuit area CA may comprise a portion of the substrate 111 and spaces above and under the portion of the substrate 111. Describing an element as being disposed on the circuit area CA means that the element is disposed on a top surface of the portion of the substrate 111. Describing an element as being disposed in the circuit area CA means that the element is disposed in the portion of the substrate 111; however, a top surface of the element may be even with the top surface of the portion of the substrate 111. Describing an element as being disposed above the circuit area CA means that the element is disposed above the top surface of the portion of the substrate 111. Describing an element as being disposed under the circuit area CA means that the element is disposed under the bottom surface of the portion of the substrate 111; wherein the element contacts the bottom surface of the portion of the substrate 111 or is distant from the bottom surface of the portion of the substrate 111. Accordingly, the non-circuit area NCA may comprise another portion of the substrate 111 and spaces above and under the other portion of the substrate 111.

It should be noted that, in the description of the present disclosure, a surface of an element (or a feature) located at the highest vertical level along the dimension Z is referred to as a top surface of the element (or the feature). A surface of an element (or a feature) located at the lowest vertical level along the dimension Z is referred to as a bottom surface of the element (or the feature).

With reference to FIG. 2, in some embodiments, the substrate 111 may include a bulk semiconductor substrate that is composed entirely of at least one semiconductor material, a plurality of device elements (not shown for clarity), a plurality of dielectric layers (not shown for clarity), and a plurality of conductive features (not shown for clarity). The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the substrate 111 may further include a semiconductor-on-insulator structure which consists of, from bottom to top, a handle substrate, an insulator layer, and a topmost semiconductor material layer. The handle substrate and the topmost semiconductor material layer may be formed of the same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and 200 nm.

It should be noted that, in the description of present disclosure, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 9, 8, 7, 6, 5, 4, 3, 2, or 1% of the reported numerical value.

The plurality of device elements may be formed on the substrate 111. Some portions of the plurality of device elements may be formed in the substrate 111. The plurality of device elements may be transistors such as complementary metal-oxide-semiconductor transistors, metal-oxide-semiconductor field-effect transistors, fin field-effect-transistors, the like, or a combination thereof.

The plurality of dielectric layers may be formed on the substrate 111 and cover the plurality of device elements. In some embodiments, the plurality of dielectric layers may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The plurality of dielectric layers may be formed by deposition processes such as chemical vapor deposition, plasma-enhanced chemical vapor deposition, or the like. Planarization processes may be performed after the deposition processes to remove excess material and provide a substantially flat surface for subsequent processing steps.

The plurality of conductive features may include interconnect layers, conductive vias, and conductive pads. The interconnect layers may be separated from each other and may be horizontally disposed in the plurality of dielectric layers along the direction Z. In the present embodiment, the topmost interconnect layers may be designated as the conductive pads. The conductive vias may connect adjacent interconnect layers along the direction Z, adjacent device element and interconnect layer, and adjacent conductive pad and interconnect layer. In some embodiments, the conductive vias may improve heat dissipation and may provide structure support. In some embodiments, the plurality of conductive features may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The plurality of conductive features may be formed during the formation of the plurality of dielectric layers.

In some embodiments, the plurality of device elements and the plurality of conductive features may together configure functional units in the substrate 111. A functional unit, in the description of the present disclosure, generally refers to functionally related circuitry that has been partitioned for functional purposes into a distinct unit. In some embodiments, functional units may be typically highly complex circuits such as processor cores, memory controllers, or accelerator units. In some other embodiments, the complexity and functionality of a functional unit may be more or less complex.

With reference to FIG. 2, the bottom dielectric layer 113 may be formed on the substrate 111. The bottom dielectric layer 113 may cover the circuit area CA and the non-circuit area NCA in a top-view perspective (not shown). In some embodiments, the bottom dielectric layer 113 may be formed of, for example, silicon oxide, borophosphosilicate glass, undoped silicate glass, fluorinated silicate glass, the like, or a combination thereof. In some embodiments, the undoped silicate glass can be expressed as formula $SiO_x$. The x may be between 1.4 and 2.1. In some embodiments, the bottom dielectric layer 113 may be formed by a deposition process such as chemical vapor deposition, plasma enhanced chemical vapor deposition, or other applicable deposition process.

In some embodiments, the bottom dielectric layer 113 may include, for example, silicon dioxide, undoped silicate glass, fluorosilicate glass, borophosphosilicate glass, a spin-on low-k dielectric layer, a chemical vapor deposition low-k dielectric layer, or a combination thereof. The term "low-k" as used throughout the present application denotes a dielectric material that has a dielectric constant of less than silicon dioxide. In some embodiments, the bottom dielectric layer 113 may include a self-planarizing material such as a spin-on glass or a spin-on low-k dielectric material such as SiLK™. The use of a self-planarizing dielectric material may avoid the need to perform a subsequent planarizing step. In some embodiments, the bottom dielectric layer 113 may be formed by a deposition process including, for example, chemical vapor deposition, plasma enhanced chemical vapor deposition, spin-on coating, or other applicable deposition process.

In some embodiments, the bottom dielectric layer 113 may be referred to as part of the plurality of dielectric layers of the substrate 111.

With reference to FIG. 2, the plurality of bottom conductive pads 211 may be formed in the bottom dielectric layer 113. The top surfaces of the plurality of bottom conductive pads 211 and the top surface of the bottom dielectric layer 113 may be substantially coplanar.

In some embodiments, pad openings (not shown) may be formed in the bottom dielectric layer 113 and a conductive material may be formed to fill the pad openings to form the plurality of bottom conductive pads 211. The pad openings may be formed by a photolithography process and a subsequent etching process.

In some embodiments, the etching process may be an anisotropic dry etching process using argon and tetrafluoromethane as etchants. The process temperature of the etching process may be between about 120° C. and about 160° C. The process pressure of the etching process may be between about 0.3 Torr and about 0.4 Torr. The process duration of the etching process may be between about 33 and about 39 seconds. Alternatively, in some embodiments, the etching process may be an anisotropic dry etching process using helium and nitrogen trifluoride as etchants. The process temperature of the etching process may be between about 80° C. and about 100° C. The process pressure of the etching process is between about 1.2 Torr and about 1.3 Torr. The process duration of the etching process may be between about 20 seconds and about 30 seconds.

In some embodiments, the pad openings may be sequentially filled with the conductive material by sputtering, electroplating, or electroless plating. For example, when the pad openings are filled by sputtering using an aluminum-copper material as source, the process temperature of sputtering may be between about 100° C. and about 400° C. The process pressure of sputtering may be between about 1 mTorr and about 100 mTorr. After sputtering, an etching process may be performed to trim the filled conductive material to form the plurality of bottom conductive pads 211. The etching process may use chlorine and argon as etchants. The etchant flow of chlorine may be between about sccm (standard cubic centimeters to minute) and about 30 sccm. The etchant flow of argon may be between about 900 sccm and about 1100 sccm. The process temperature of the etching process may be between about 50° C. and about 200° C. The process pressure of the etching process may be between about 50 mTorr and about 10 Torr. The process duration of the etching process may be between about 30 seconds and about 200 seconds. In this example, the plurality of bottom conductive pads 211 may have a thickness between about 400 nm and about 1100 nm and the plurality of bottom conductive pads 211 may be formed of aluminum-copper alloy. Small quantities of copper in aluminum may improve the electromigration resistance and further reduce the occurrence of hillocks, which is small protrusions of aluminum on a surface of a thin film layer of aluminum.

For another example, the pad openings may be filled by an electroplating process using a plating solution. The plating solution may include copper sulfate, copper methane sulfonate, copper gluconate, copper sulfamate, copper nitrate, copper phosphate, or copper chloride. The pH of the plating solution may be between about 2 and about 6 or between about 3 and about 5. The process temperature of the electroplating process may be maintained between about 40° C. and about 75° C. or between about 50° C. and about 70° C. In this example, the plurality of bottom conductive pads 211 may be formed of copper.

In some embodiments, the plating solution may include accelerators, suppressors, or levelers. The accelerators may include a polar sulfur, oxygen, or nitrogen functional group that help to increase deposition rates and may promote dense nucleation. The accelerators may be present at a low concentration level, for example, between about 0 and about 200 ppm. The suppressors are additives that reduce the plating rate and are usually present in the plating bath at higher concentrations, for example, between about 5 ppm and about 1000 ppm. The suppressors may be polymeric surfactants with high molecular weight, such as polyethylene glycol.

The suppressors may slow down the deposition rate by adsorbing on the surface and forming a barrier layer to the copper ions. Because of their large size and low diffusion rate, the suppressors are less likely to reach the lower part of the pad opening. Therefore, most of the suppressing effect may occur at the upper part of the pad opening, helping to reduce overburden of the filling material (e.g., copper) and avoid the pad openings "closing."

The leveler may be used to improve filling performance, decrease the surface roughness, and prevent copper deposition at the upper part of the pad opening. The levelers may be present in a small concentration, for example, between about 1 ppm and about 100 ppm. The levelers may be, for example, 3-mercapto-1-propanesulfonate, (3-sulfopropyl) disulfide, or 3,3-thiobis (1-propanesulfonate).

In some embodiments, the plurality of bottom conductive pads 211 may be part of the conductive features of the substrate 111.

With reference to FIG. 3, the middle dielectric layer 115 may be formed on the bottom dielectric layer 113. The middle dielectric layer 115 may cover the circuit area CA and the non-circuit area NCA in a top-view perspective (not shown). In some embodiments, the middle dielectric layer 115 may be formed of, for example, silicon oxide, borophosphosilicate glass, undoped silicate glass, fluorinated silicate glass, the like, or a combination thereof. In some embodiments, the undoped silicate glass can be expressed as formula $SiO_x$. The x may be between 1.4 and 2.1. In some embodiments, the middle dielectric layer 115 may be formed by a deposition process such as chemical vapor deposition, plasma enhanced chemical vapor deposition, or other applicable deposition process.

In some embodiments, the middle dielectric layer 115 may include, for example, silicon dioxide, undoped silicate glass, fluorosilicate glass, borophosphosilicate glass, a spin-on low-k dielectric layer, a chemical vapor deposition low-k dielectric layer, or a combination thereof. In some embodiments, the middle dielectric layer 115 may include a self-planarizing material such as a spin-on glass or a spin-on low-k dielectric material such as SiLK™. The use of a self-planarizing dielectric material may avoid the need to perform a subsequent planarizing step. In some embodiments, the middle dielectric layer 115 may be formed by a deposition process including, for example, chemical vapor deposition, plasma enhanced chemical vapor deposition, spin-on coating, or other applicable deposition process.

In some embodiments, the thickness T2 of the middle dielectric layer 115 and the thickness T1 of the bottom dielectric layer 113 may be different. For example, the thickness T2 of the middle dielectric layer 115 may be greater than the thickness T1 of the bottom dielectric layer 113. In some embodiments, the thickness T2 of the middle dielectric layer 115 and the thickness T1 of the bottom dielectric layer 113 may be substantially the same.

In some embodiments, the middle dielectric layer 115 may be referred to as part of the plurality of dielectric layers of the substrate 111.

With reference to FIG. 3, the plurality of middle interconnectors 221 may be formed on the plurality of bottom conductive pads 211, respectively and correspondingly. The plurality of middle conductive pads 213 may be formed on the plurality of middle interconnectors 221, respectively and correspondingly. In some embodiments, the plurality of middle interconnectors 221 and the plurality of middle conductive pads 213 may be formed by, for example, a damascene process, but is not limited thereto. In some embodiments, the plurality of middle interconnectors 221 and the plurality of middle conductive pads 213 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

Figure 6:
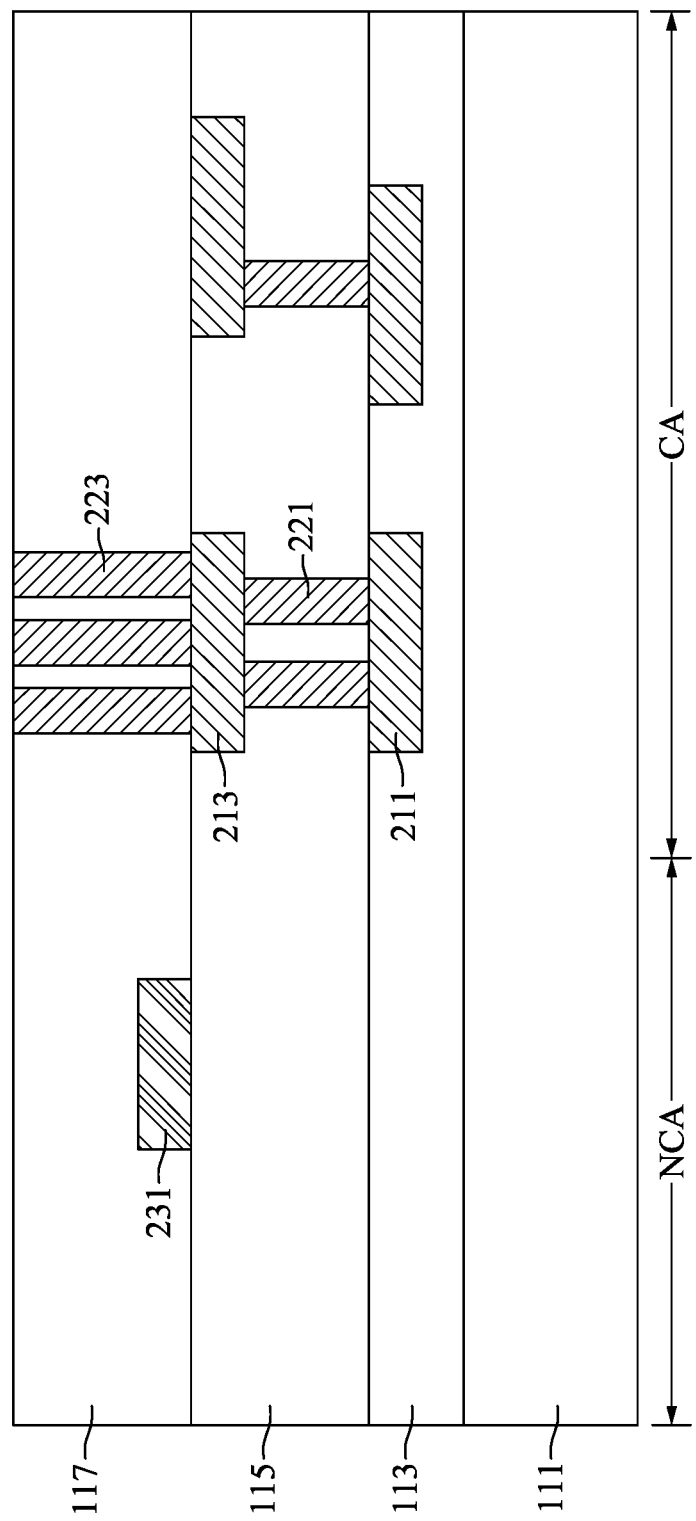
Figure 7:
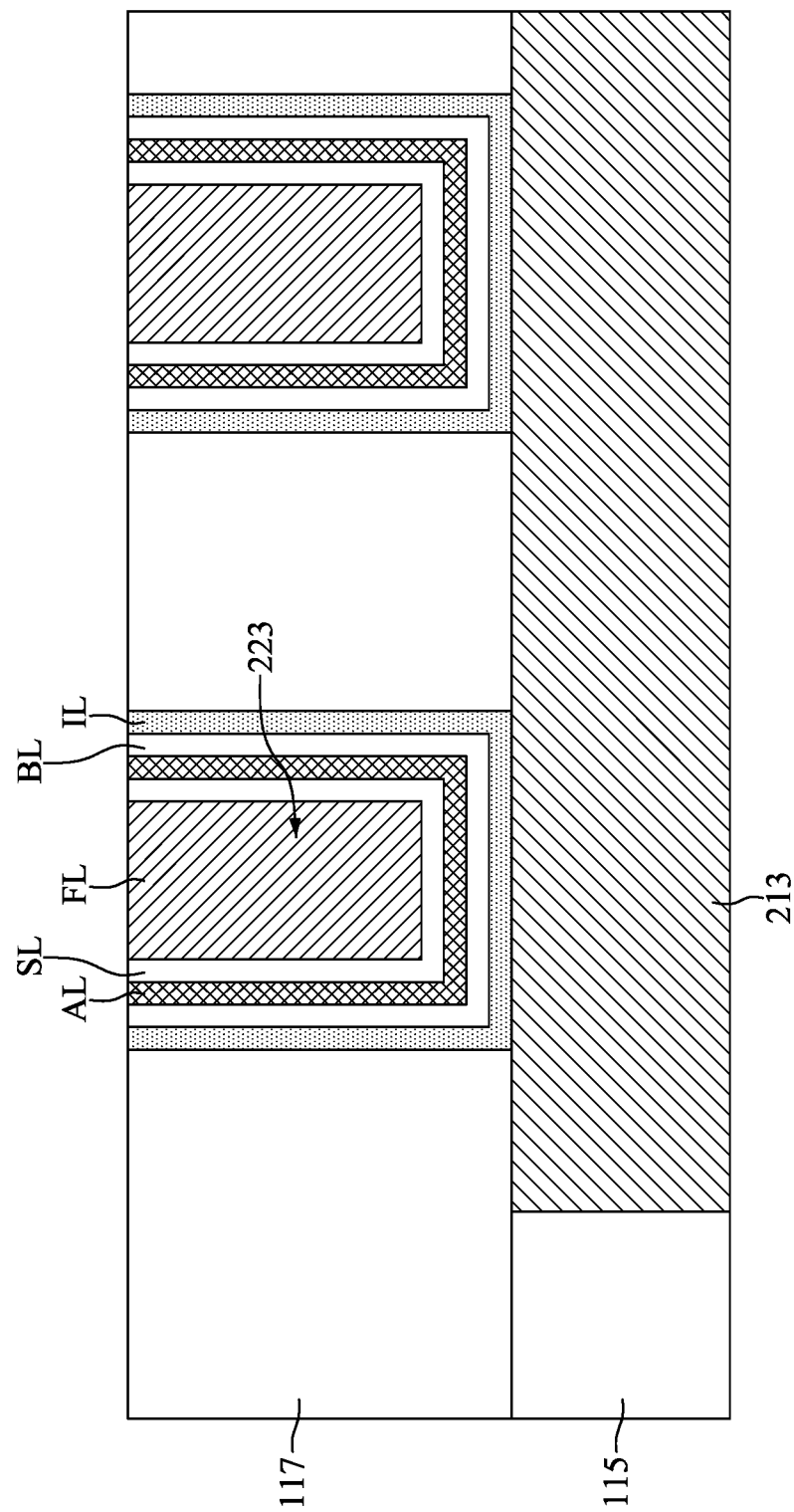
FIG. 7 is a close-up schematic cross-sectional view diagram of FIG. 6.

FIG. 7 is a close-up schematic cross-sectional view diagram of FIG. 6. FIGS. 8 to 17 illustrate, in schematic cross-sectional view diagrams, part of the flow for fabricating the semiconductor device 1A in accordance with one embodiment of the present disclosure.

With reference to FIG. 1 and FIGS. 4 to 9, at step S13, a bottom cushion layer 231 may be formed on the middle dielectric layer 115 and above the non-circuit area NCA, a top dielectric layer 117 may be formed on the middle dielectric layer 115, a plurality of top interconnectors 223 may be formed on the plurality of middle conductive pads 213, and a top cushion layer 233 may be formed on the bottom cushion layer 231.

Figure 4:
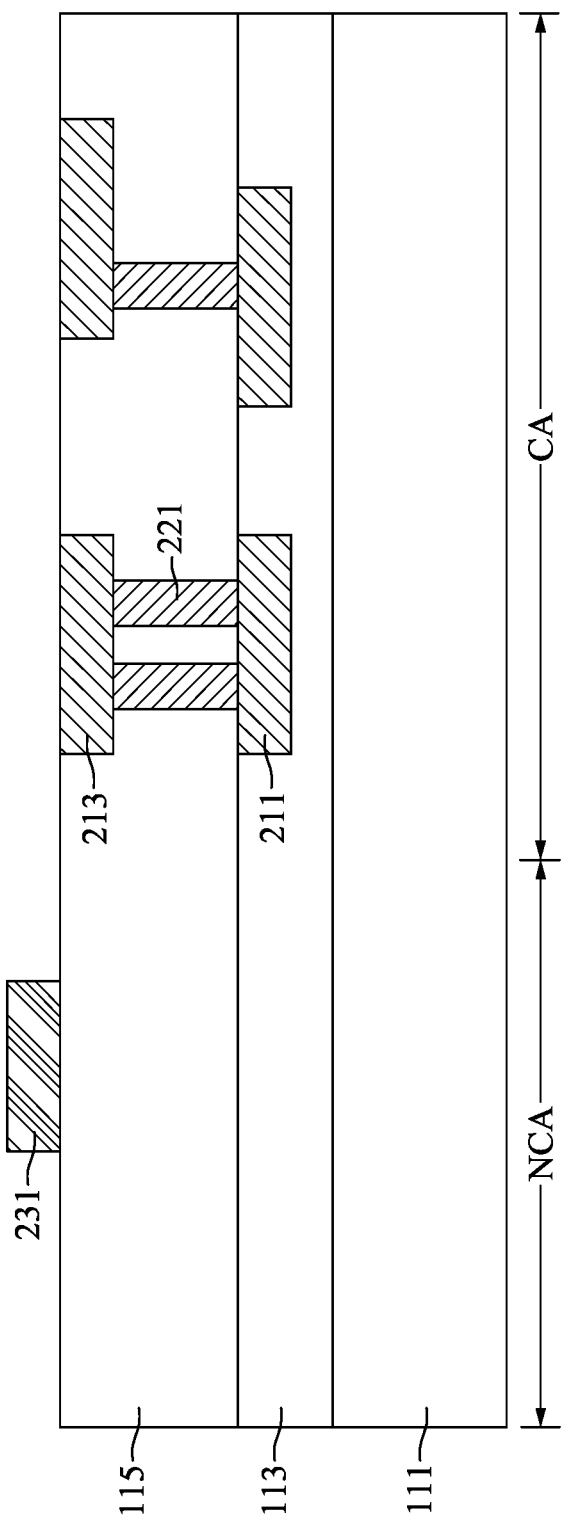

With reference to FIG. 4, the bottom cushion layer 231 may be formed on the middle dielectric layer 115. The bottom cushion layer 231 may be formed above the non-circuit area NCA. In other words, the bottom cushion layer 231 may be distant from the conductive features such as the plurality of middle conductive pads 213 and the plurality of middle interconnectors 221. In some embodiments, the bottom cushion layer 231 may be formed of, for example, polyimide, polybenzoxazole, or benzocyclobutene. The bottom cushion layer 231 may be formed by, for example, spin coating, laminating, or the like. A photolithography process and a following etching process may be performed to form the bottom cushion layer 231 with desired profile and position.

In some embodiments, the bottom cushion layer 231 may be formed of, for example, a material having a coefficient of thermal expansion of less than about 20 ppm/° C. and a Young's Modulus of less than about 15 GPa. For example, the bottom cushion layer 231 may be formed of a material including polyimide or an epoxy-based material.

Figure 5:
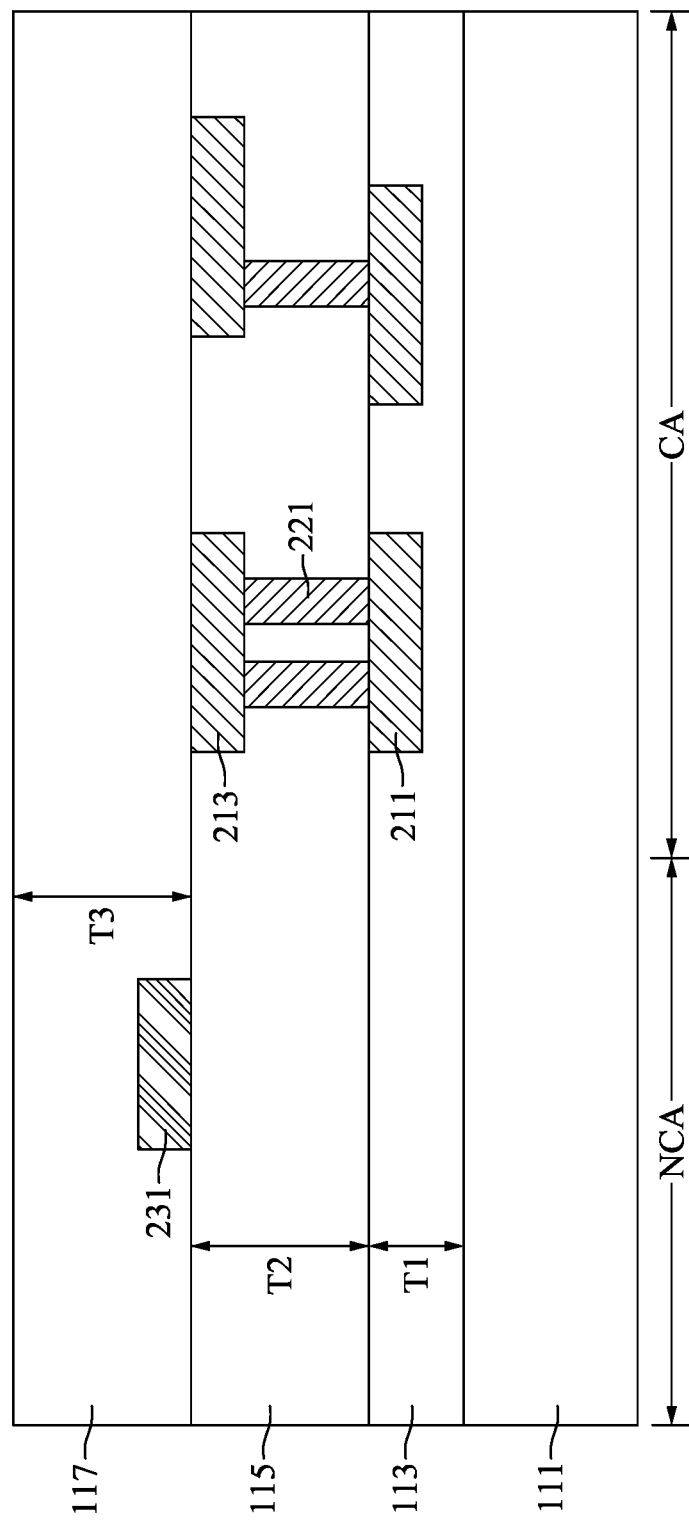

With reference to FIG. 5, the top dielectric layer 117 may be formed on the middle dielectric layer 115 to cover the bottom cushion layer 231. The top dielectric layer 117 may cover the circuit area CA and the non-circuit area NCA in a top-view perspective (not shown). In some embodiments, the top dielectric layer 117 may be formed of, for example, silicon oxide, borophosphosilicate glass, undoped silicate glass, fluorinated silicate glass, the like, or a combination thereof. In some embodiments, the undoped silicate glass can be expressed as formula $SiO_x$. The x may be between 1.4 and 2.1. In some embodiments, the top dielectric layer 117 may be formed by a deposition process such as chemical vapor deposition, plasma enhanced chemical vapor deposition, or other applicable deposition process. In some embodiments, a planarization process, such as chemical mechanical polishing, may be performed to remove excess material and provide a substantially flat surface for subsequent processing steps.

In some embodiments, the top dielectric layer 117 may include, for example, silicon dioxide, undoped silicate glass, fluorosilicate glass, borophosphosilicate glass, a spin-on low-k dielectric layer, a chemical vapor deposition low-k dielectric layer, or a combination thereof. In some embodiments, the top dielectric layer 117 may include a self-planarizing material such as a spin-on glass or a spin-on low-k dielectric material such as SiLK™. The use of a self-planarizing dielectric material may avoid the need to perform a subsequent planarizing step. In some embodiments, the top dielectric layer 117 may be formed by a deposition process including, for example, chemical vapor deposition, plasma enhanced chemical vapor deposition, spin-on coating, or other applicable deposition process.

In some embodiments, the thickness T3 of the top dielectric layer 117 and the thickness T2 of the middle dielectric layer 115 may be different. For example, the thickness T3 of the top dielectric layer 117 may be greater than the thickness T2 of the middle dielectric layer 115. In some embodiments, the thickness T3 of the top dielectric layer 117 and the thickness T2 of the middle dielectric layer 115 may be substantially the same.

In some embodiments, the top dielectric layer 117 may be referred to as part of the plurality of dielectric layers of the substrate 111.

With reference to FIGS. 6 and 7, the plurality of top interconnectors 223 may be formed along the top dielectric layer 117. The plurality of top interconnectors 223 may be formed on the plurality of middle conductive pads 213, respectively and correspondingly.

For brevity, clarity, and convenience of description, only one top interconnector 223 is described. In some embodiments, the top interconnector 223 may include a filler layer FL, a seed layer SL, an adhesive layer AL, a barrier layer BL, and an isolation layer IL.

In some embodiments, the filler layer FL may be formed buried in the top dielectric layer 117. The filler layer FL may be formed of, for example, doped polysilicon, tungsten, copper, carbon nanotube, or solder alloy.

In some embodiments, the isolation layer IL may be formed between the filler layer FL and the top dielectric layer 117. The isolation layer IL may have a U-shaped cross-sectional profile. In some embodiments, the isolation layer IL may be formed of, for example, silicon oxide, silicon nitride, silicon oxynitride, or tetra-ethyl ortho-silicate. The isolation layer IL may have a thickness between about 50 nm and about 200 nm. In some embodiments, the isolation layer IL may be formed of, for example, parylene, epoxy, or poly(p-xylene). The isolation layer IL may have a thickness between about 1 μm and about 5 μm. The isolation layer IL may ensure the filler layer FL is electrically isolated in the top dielectric layer 117.

In some embodiments, the seed layer SL may have a U-shaped cross-sectional profile. The seed layer SL may be formed between the filler layer FL and the isolation layer IL. In some embodiments, the seed layer SL may have a thickness between about 10 nm and about 40 nm. In some embodiments, the seed layer SL may include, for example, at least one selected from the group consisting of aluminum, gold, beryllium, bismuth, cobalt, copper, hafnium, indium, manganese, molybdenum, nickel, lead, palladium, platinum, rhodium, rhenium, lutetium, tantalum, tellurium, titanium, tungsten, zinc, and zirconium. The seed layer SL may reduce the resistivity of an opening (not shown) during the formation of the filler layer FL.

In some embodiments, the adhesive layer AL may have a U-shaped cross-sectional profile. The adhesive layer AL may be formed between the seed layer SL and isolation layer IL. The adhesive layer AL may be formed of, for example, titanium, tantalum, titanium tungsten, or manganese nitride. The adhesive layer AL may improve an adhesion between the seed layer SL and the barrier layer BL.

In some embodiments, the barrier layer BL may have a U-shaped cross-sectional profile. The barrier layer BL may be between the adhesive layer AL and the isolation layer IL. The barrier layer BL may be formed of, for example, tantalum, tantalum nitride, titanium, titanium nitride, rhenium, nickel boride, or tantalum nitride/tantalum bilayer. The barrier layer BL may inhibit diffusion of the conductive materials of the filler layer FL into the top dielectric layer 117.

Figure 8:
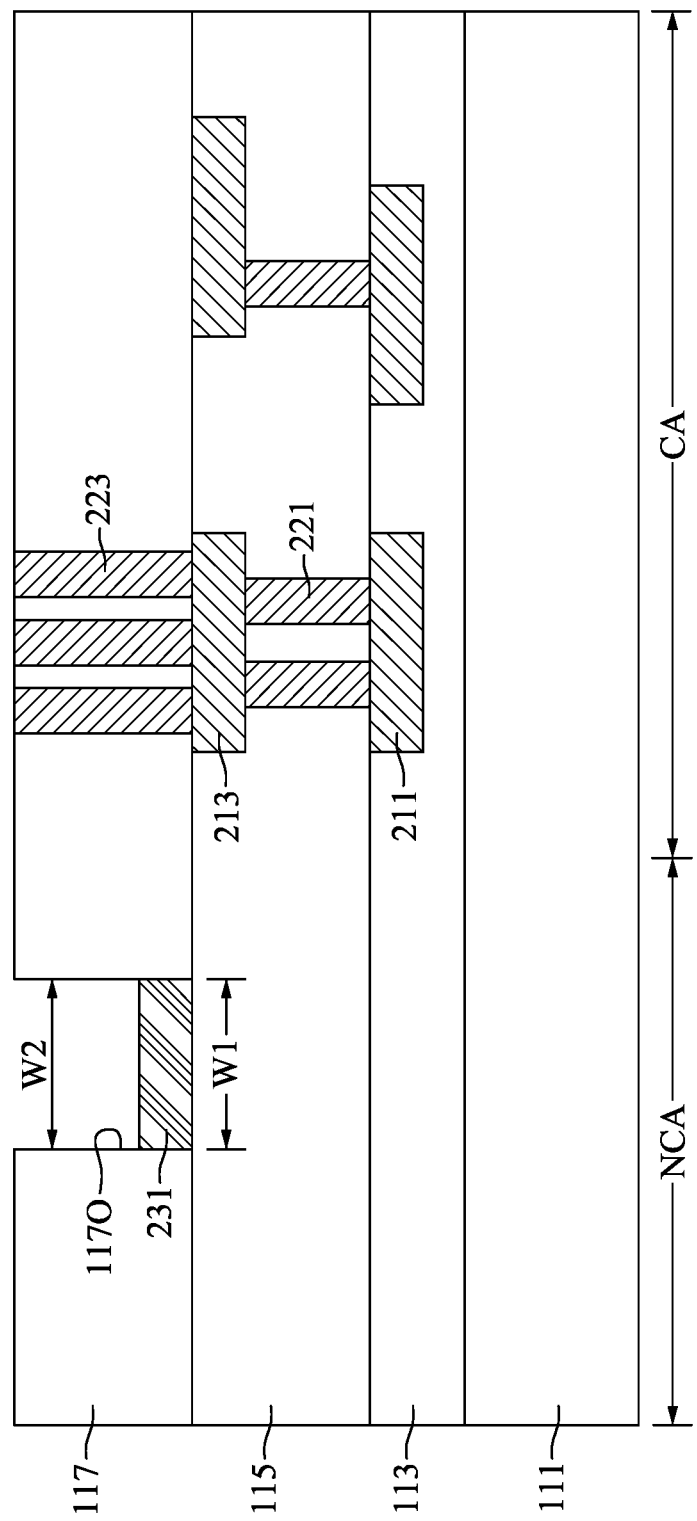
FIGS. 8 to 17 illustrate, in schematic cross-sectional view diagrams, part of the flow for fabricating the semiconductor device in accordance with one embodiment of the present disclosure.

With reference to FIG. 8, an opening 117O may be formed in the top dielectric layer 117 to expose the bottom cushion layer 231. In some embodiments, the width W2 of the opening 117O and the width W2 of the bottom cushion layer 231 may be substantially the same. In some embodiments, the width W2 of the opening 117O may be greater than the width W1 of the bottom cushion layer 231. In such a situation, the top surface and the sidewalls of the bottom cushion layer 231 may be both exposed through the opening 117O. In some embodiments, the width W2 of the opening 117O may be slightly less than the width W1 of the bottom cushion layer 231. The ratio of the width W2 of the opening 117O to the width W1 of the bottom cushion layer 231 may be between about 0.8 and about 0.95.

Figure 9:
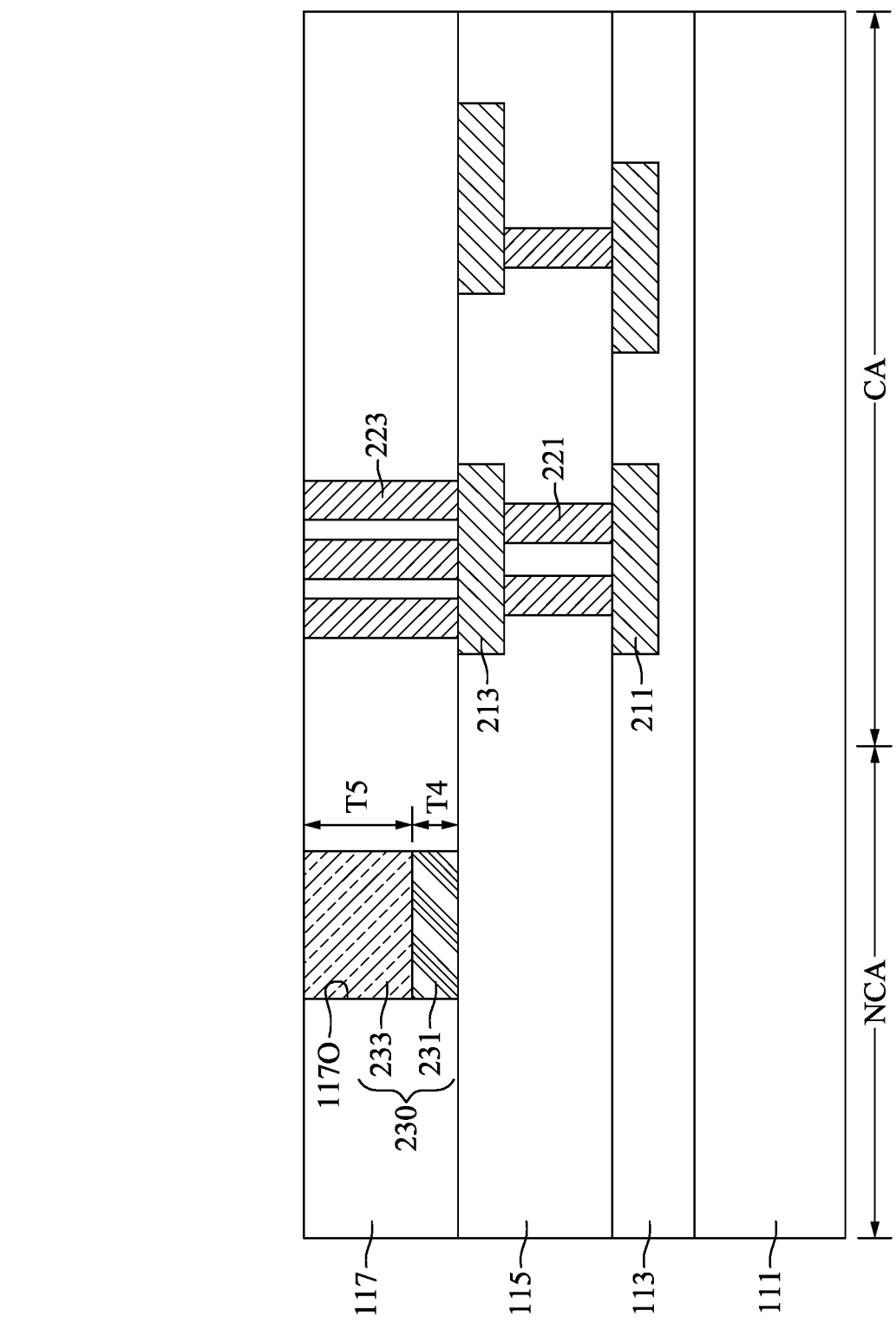

With reference to FIG. 9, the top cushion layer 233 may be formed in the opening 117O. In some embodiments, a layer of energy-removable material (not shown) may be deposited to completely fill the opening 117O. A planarization process, such as chemical mechanical polishing, may be sequentially performed to remove excess material and provide a substantially flat surface for subsequent processing steps. An energy treatment may be applied to turn the layer of energy-removable material into the top cushion layer 233 and bring porosity to the top cushion layer 233.

In some embodiments, the energy-removable material may include a thermal decomposable material, a photonic decomposable material, an e-beam decomposable material, or a combination thereof. For example, the energy-removable material may include a base material and a decomposable porogen material that is sacrificially removed upon exposure to an energy source. The base material may include a methylsilsesquioxane based material. The decomposable porogen material may include a porogen organic compound that provides porosity to the base material.

In some embodiments, the energy-removable material may include a relatively high concentration of the decomposable porogen material and a relatively low concentration of the base material but is not limited thereto. For example, the energy-removable material may include about 75% or greater of the decomposable porogen material, and about 25% or less of the base material. In another example, the energy-removable material may include about 95% or greater of the decomposable porogen material, and about 5% or less of the base material. In another example, the energy-removable material may include about 100% of the decomposable porogen material, and no base material is used. In another example, the energy-removable material may include about 45% or greater of the decomposable porogen material, and about 55% or less of the base material.

In some embodiments, the energy treatment may be performed to the layer of the energy-removable material by applying the energy source thereto. The energy source may include heat, light, or a combination thereof. When heat is used as the energy source, the temperature of the energy treatment may be between about 800° C. and about 900° C. When light is used as the energy source, an ultraviolet light may be applied. The energy treatment may remove the decomposable porogen material from the energy-removable material to generate empty spaces (pores), with the base material remaining in place. That is, the top cushion layer 233 may become porous. The base material may turn into a skeleton of the top cushion layer 233 and the empty spaces may be distributed among the skeleton of the top cushion layer 233. According to the composition of the energy-removable material, the top cushion layer 233 may have a porosity of 45%, 75%, 95%, or 100%.

With reference to FIG. 9, the bottom cushion layer 231 and the top cushion layer 233 may together configure a cushion structure 230 in the top dielectric layer 117 and above the non-circuit area NCA. In some embodiments, the cushion structure 230 may only include the top cushion layer 233. In some embodiments, the cushion structure 230 may only include the bottom cushion layer 231. In some embodiments, the thickness ratio between the thickness T4 of the bottom cushion layer 231 to the thickness T5 of the top cushion layer 233 may be between about 0.1 and 1.5.

With reference to FIG. 1 and FIGS. 10 to 13, at step S15, a top conductive pad 215 may be formed on the plurality of top interconnectors 223, a bottom passivation layer 241 may be formed on the top dielectric layer 117, a redistribution layer 311 may be formed on the top conductive pad 215.

Figure 10:
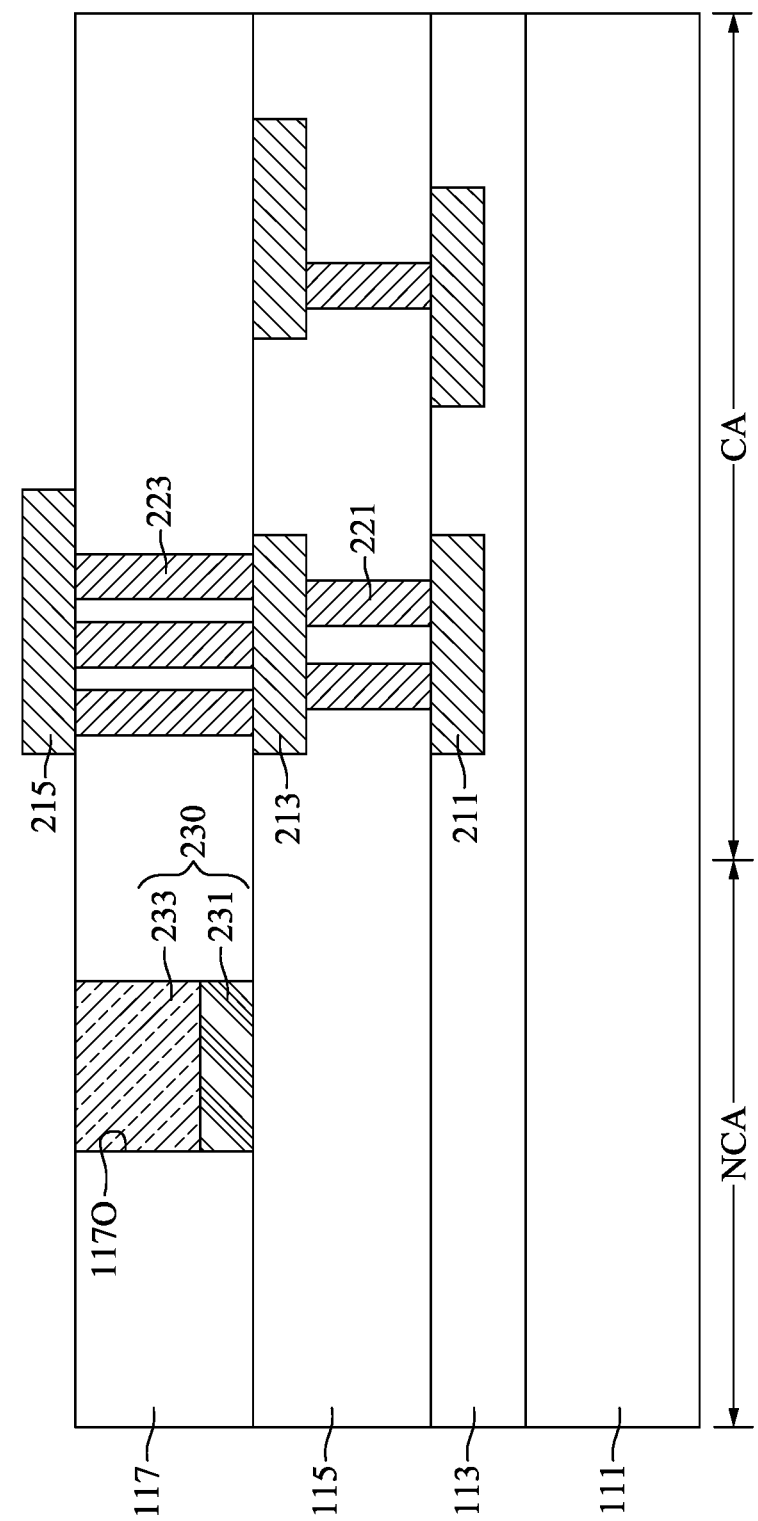

With reference to FIG. 10, the top conductive pad 215 may be formed on the plurality of top interconnectors 223. The top conductive pad 215 may be formed above the circuit area CA. In some embodiments, the top conductive pad 215 may be formed by initially forming a seed layer (not separately shown in FIG. 10). The seed layer may be a thin layer of a conductive material that aids in the formation of a thicker layer during subsequent processing steps. The seed layer may include a layer of titanium about 1,000 Angstroms thick followed by a layer of copper about 5,000 Angstroms thick. The seed layer may be formed using processes such as sputtering, evaporation, or plasma-enhanced chemical vapor deposition, depending upon the desired materials. The seed layer may be formed to have a thickness of between about 0.3 µm and about 1 µm, such as about 0.5 µm.

Once the seed layer has been formed the top conductive pad 215 may be formed over the seed layer. In some embodiments, the top conductive pad 215 may include one or more conductive materials, such as copper, tungsten, other conductive metals, or the like, and may be formed, for example, by electroplating, electroless plating, or the like. In some embodiments, a photoresist (not separately shown in FIG. 10) may be placed on the seed layer and patterned to expose the seed layer where the top conductive pad 215 is desired to be formed.

Once patterned, an electroplating process may be used wherein the seed layer and the photoresist are submerged or immersed in the electroplating solution. The seed layer surface may be electrically connected to the negative side of an external DC power supply such that the seed layer functions as the cathode in the electroplating process. A solid conductive anode, such as a copper anode, may be also immersed in the solution and may be attached to the positive side of the power supply. The atoms from the anode are dissolved into the solution, from which the cathode (e.g., the seed layer) acquires the dissolved atoms, thereby plating the exposed conductive areas of the seed layer within the opening of the photoresist.

Figure 11:
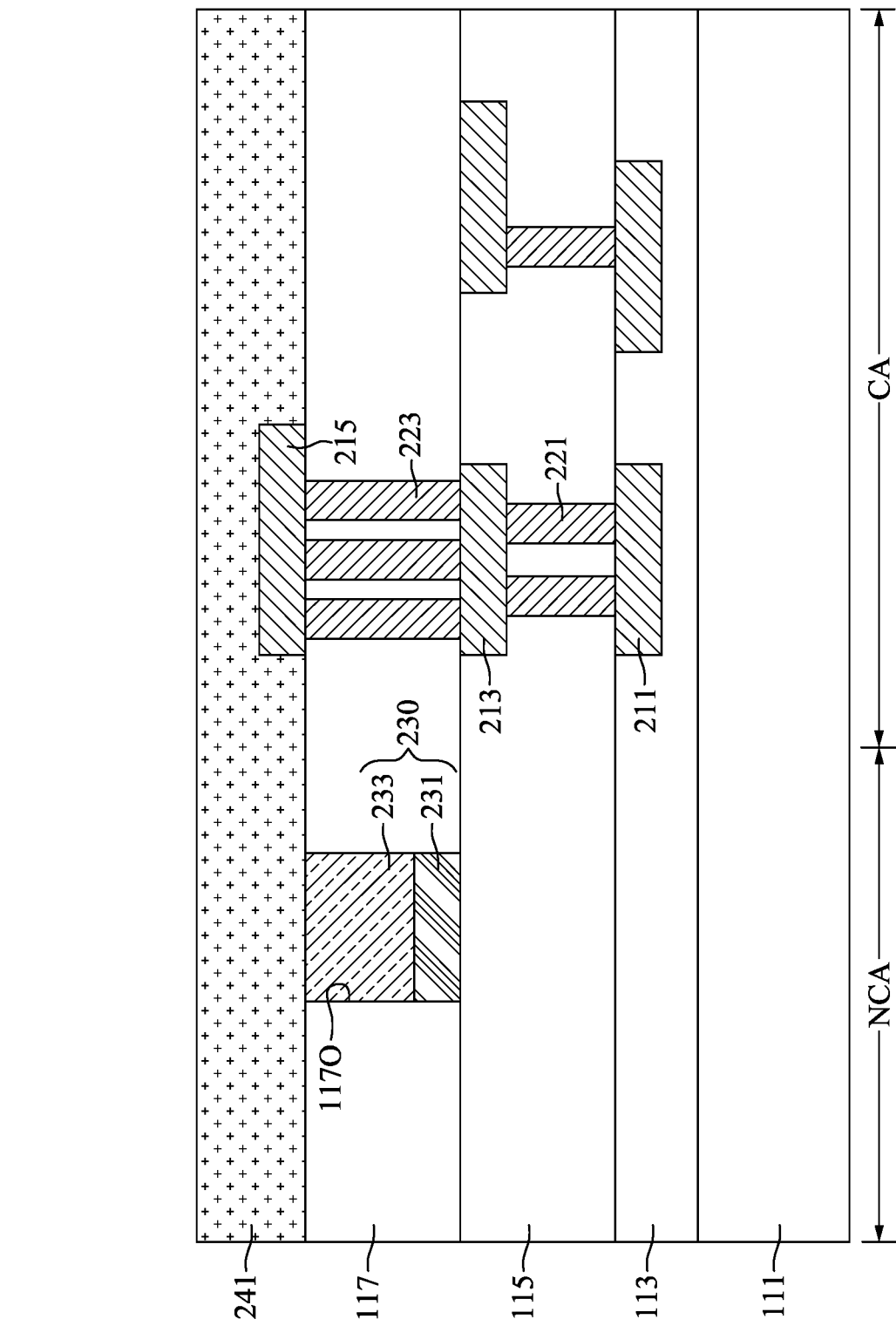

With reference to FIG. 11, the bottom passivation layer 241 may be formed on the top dielectric layer 117 to cover the top conductive pad 215. The bottom passivation layer 241 may cover the circuit area CA and the non-circuit area NCA in a top-view perspective (not shown). In some embodiments, the top dielectric layer 117 may be formed of, for example, silicon oxide, borophosphosilicate glass, undoped silicate glass, fluorinated silicate glass, the like, or a combination thereof. In some embodiments, the undoped silicate glass can be expressed as formula $SiO_x$. The x may be between 1.4 and 2.1. In some embodiments, the bottom passivation layer 241 may be formed by a deposition process such as chemical vapor deposition, plasma enhanced chemical vapor deposition, or other applicable deposition process. In some embodiments, a planarization process, such as chemical mechanical polishing, may be performed to remove excess material and provide a substantially flat surface for subsequent processing steps.

In some embodiments, the bottom passivation layer 241 may include, for example, silicon dioxide, undoped silicate glass, fluorosilicate glass, borophosphosilicate glass, a spin-on low-k dielectric layer, a chemical vapor deposition low-k dielectric layer, or a combination thereof. In some embodiments, the bottom passivation layer 241 may include a self-planarizing material such as a spin-on glass or a spin-on low-k dielectric material such as SiLK™. The use of a self-planarizing dielectric material may avoid the need to perform a subsequent planarizing step. In some embodiments, the bottom passivation layer 241 may be formed by a deposition process including, for example, chemical vapor deposition, plasma enhanced chemical vapor deposition, spin-on coating, or other applicable deposition process.

In some embodiments, the bottom passivation layer 241 may be formed of the same material as the top dielectric layer 117.

Figure 12:
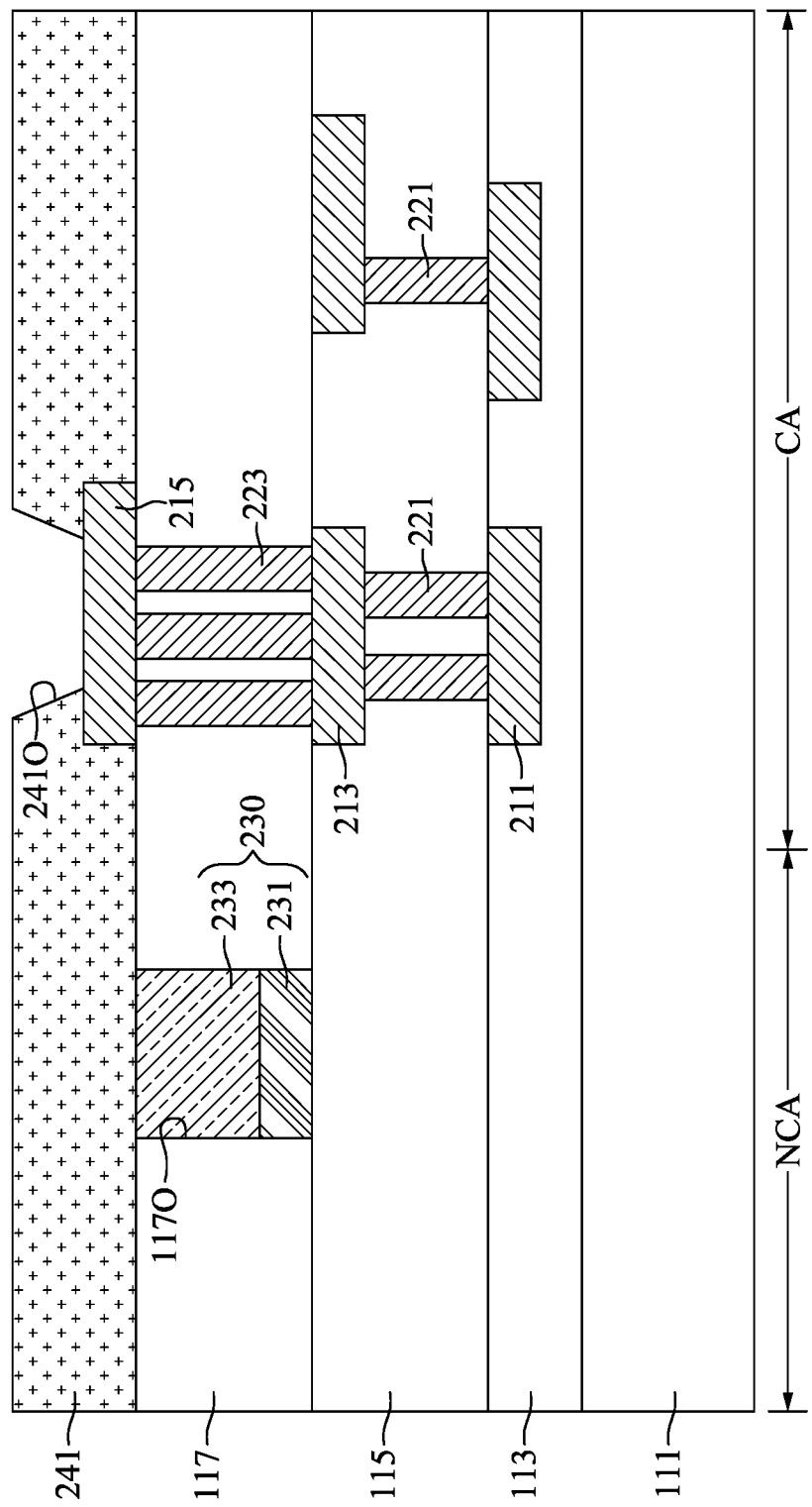

With reference to FIG. 12, an opening 241O may be formed to expose a portion of the top surface of the top conductive pad 215. The opening 241O may be formed above the circuit area CA.

Figure 13:
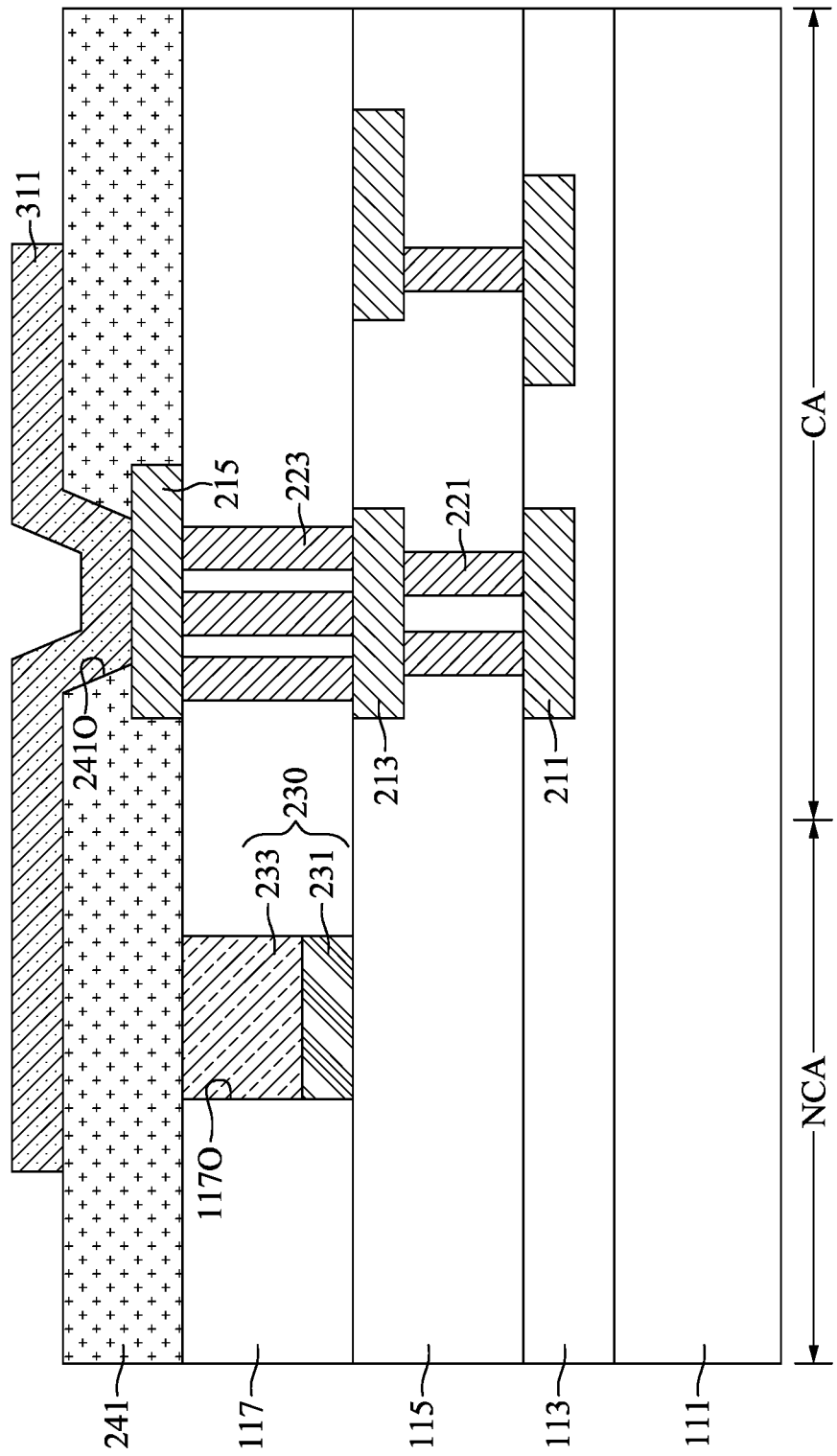

With reference to FIG. 13, the redistribution layer 311 may be formed in the opening 241O and on the top conductive pad 215. The redistribution layer 311 may also form on the bottom passivation layer 241 to horizontally extend from the circuit area CA to the non-circuit area NCA. The redistribution layer 311 may be utilized to extend the electrical connection of the top conductive pad 215 from the circuit area CA to the non-circuit area NCA.

In some embodiments, the redistribution layer 311 may be formed by initially forming a seed layer (not separately shown in FIG. 13) of a titanium copper alloy through a suitable formation process such as chemical vapor deposition or sputtering. A photoresist (not shown) may then be formed to cover the seed layer, and the photoresist may then be patterned to expose those portions of the seed layer that are located where the redistribution layer 311 is desired to be located.

Once the photoresist has been formed and patterned, a conductive material, such as copper, may be formed on the seed layer through a deposition process such as plating. The conductive material may be formed to have a thickness of between about 1 µm and about 10 µm, such as about 5 µm. However, while the material and methods discussed are suitable to form the conductive material, these materials are merely exemplary. Any other suitable materials, such as AlCu or Au, and any other suitable processes of formation, such as chemical vapor deposition or physical vapor deposition, may alternatively be used to form the redistribution layer 311.

Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

With reference to FIG. 1 and FIGS. 14 to 17, at step S17, a top passivation layer 243 may be formed on the bottom passivation layer 241, a connector barrier layer 321 may be formed on the redistribution layer 311 and above the non-circuit area NCA, and an external connector 323 may be formed on the connector barrier layer 321.

Figure 14:
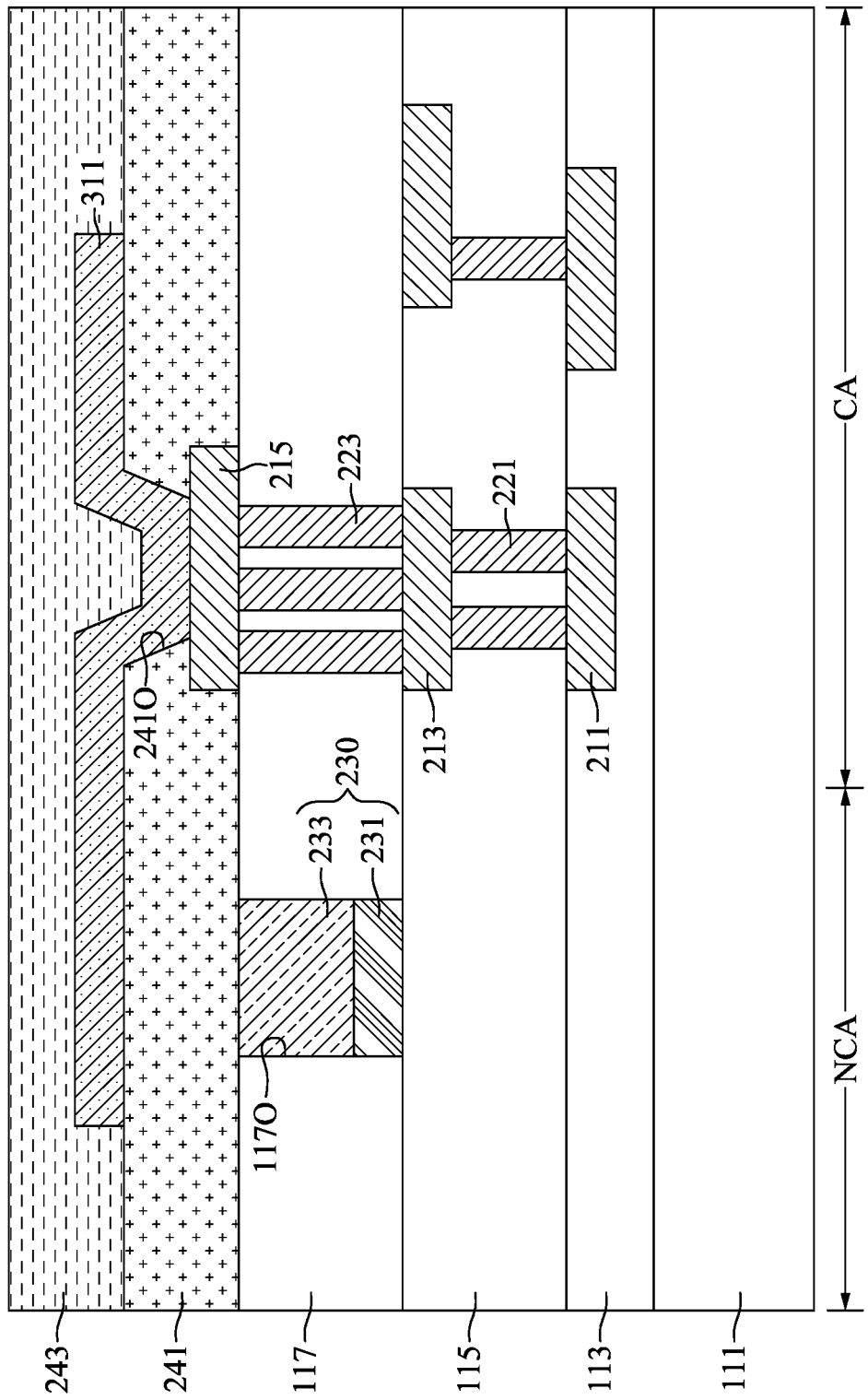

With reference to FIG. 14, the top passivation layer 243 may be formed on the bottom passivation layer 241 and cover the redistribution layer 311. The top passivation layer 243 may cover the circuit area CA and the non-circuit area NCA in a top-view perspective (not shown). In some embodiments, the first passivation layer 111 may be a single layer structure or a multi-layer structure. In some embodiments, the top passivation layer 243 may include polybenzoxazole, polyimide, benzocyclobutene, ajinomoto buildup film, solder resist film, or the like, or a combination thereof. The top passivation layer 243 may be formed by, for example, spin-coating, lamination, deposition, or the like. The deposition may include chemical vapor deposition. A planarization process, such as chemical mechanical polishing, may be performed to remove excess material and provide a substantially flat surface for subsequent processing steps.

Figure 15:
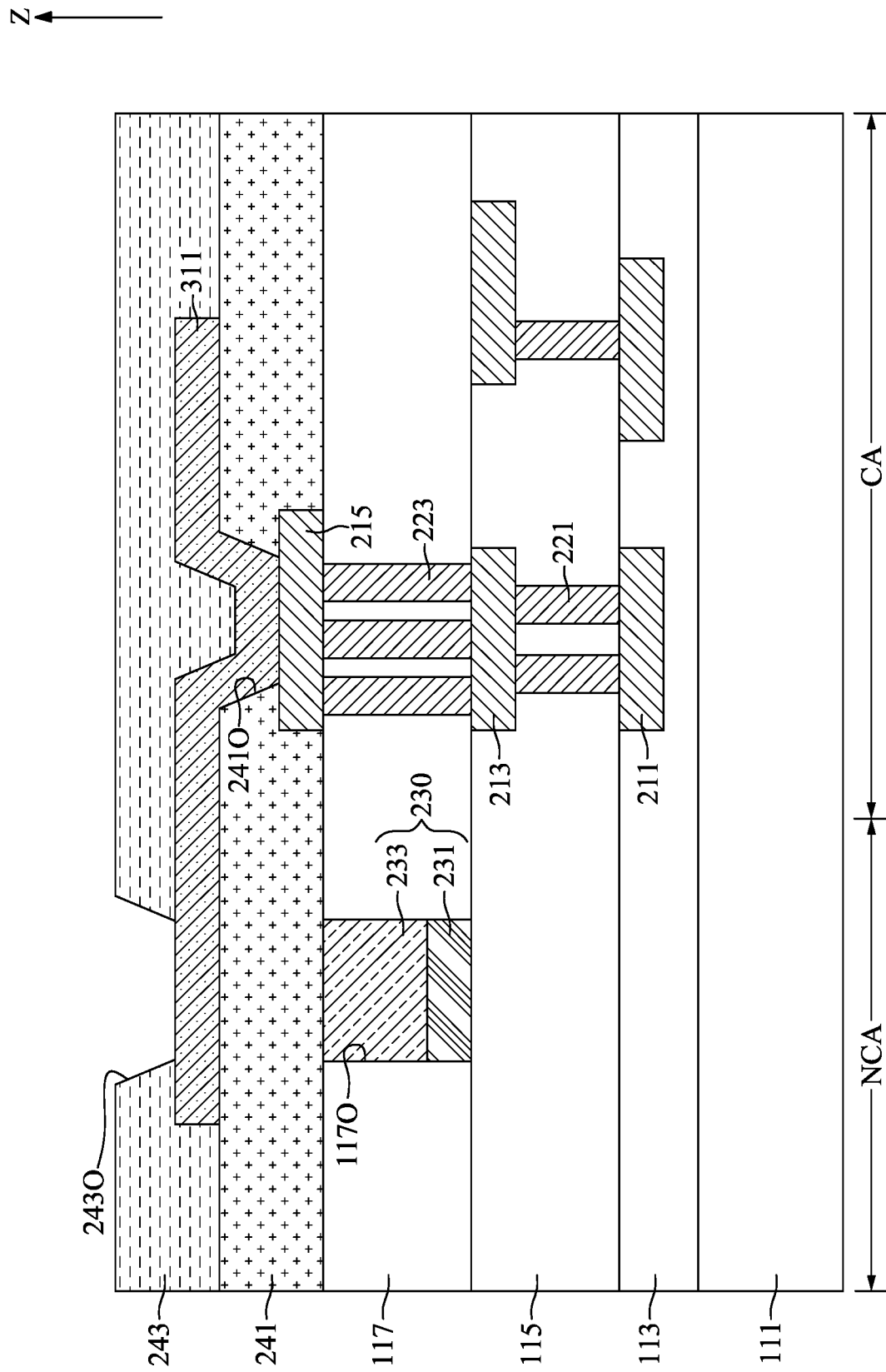

With reference to FIG. 15, an opening 243O may be formed to expose a portion of the redistribution layer 311. The opening 243O may be formed above the non-circuit area NCA.

Figure 16:
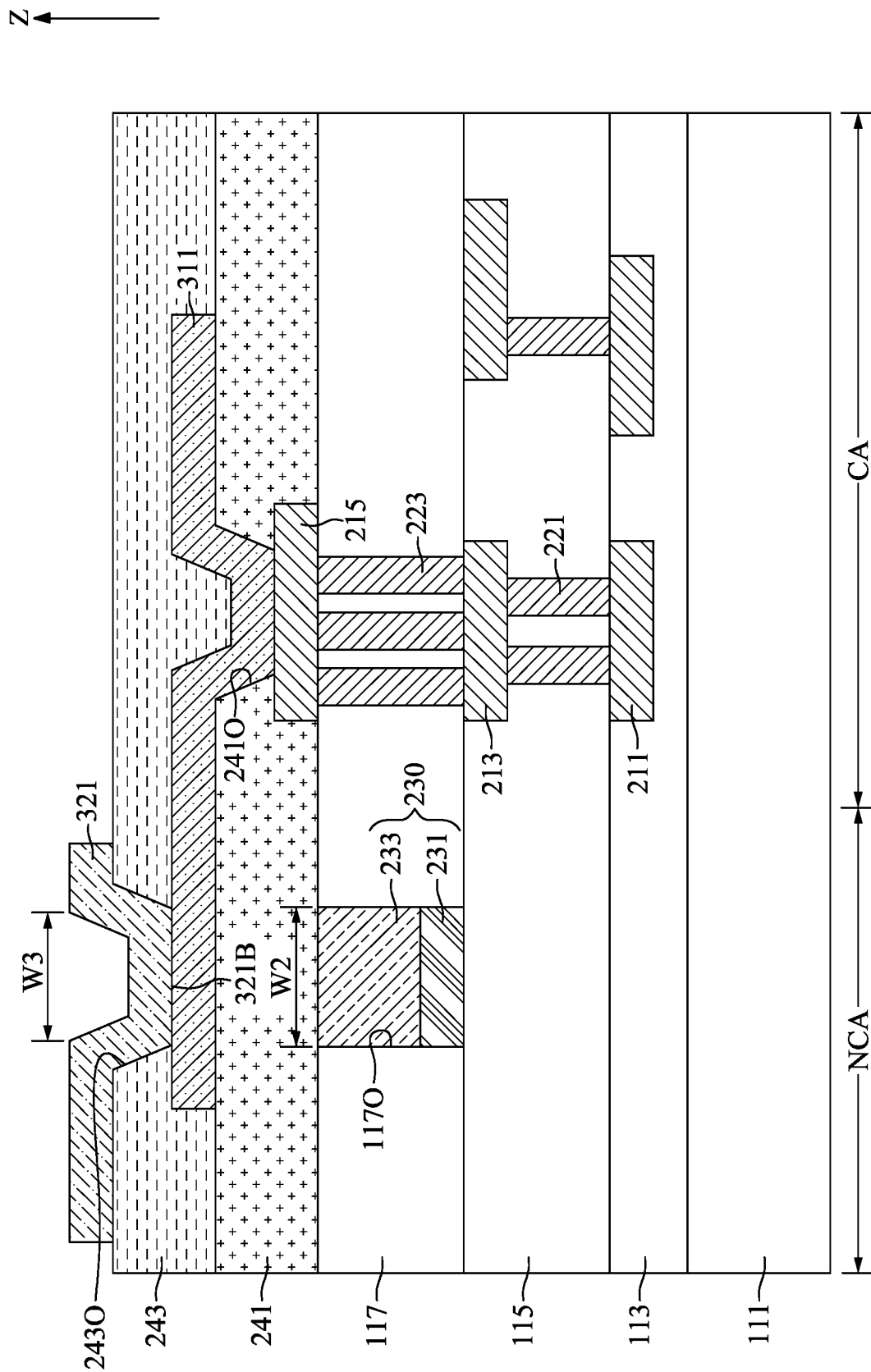

With reference to FIG. 16, the connector barrier layer 321 may be formed on the redistribution layer 311 through the opening 243O. The connector barrier layer 321 may also form on the connector barrier layer 321 and above the non-circuit area NCA. In some embodiments, the connector barrier layer 321 may be a single layer structure or a stacked structure of multiple layers. For example, the connector barrier layer 321 may include a first conductive layer (not shown), a second conductive layer (not shown), and a third conductive layer (not shown) stacked sequentially. The first conductive layer may serve as an adhesive layer for stably attaching the external connector 323 to the redistribution layer 311. For example, the first conductive layer may include at least one of titanium, titanium-tungsten, chromium, and aluminum. The second conductive layer may serve as a barrier layer for preventing a conductive material contained in the external connector 323 from diffusing into the top passivation layer 243. The second conductive layer may include at least one of copper, nickel, chromium-copper, and nickel-vanadium. The third conductive layer may serve as a seed layer for forming the external connector 323 or as a wetting layer for improving wetting characteristics of the external connector 323. The third conductive layer may include at least one of nickel, copper, and aluminum.

In some embodiments, the width W3 of the bottom surface 321B of the connector barrier layer 321 and the width W2 of the top cushion layer 233 (which is determined by the opening 117O) may be substantially the same. In some embodiments, the width W3 of the bottom surface 321B of the connector barrier layer 321 may be less than the width W2 of the top cushion layer 233.

Figure 17:
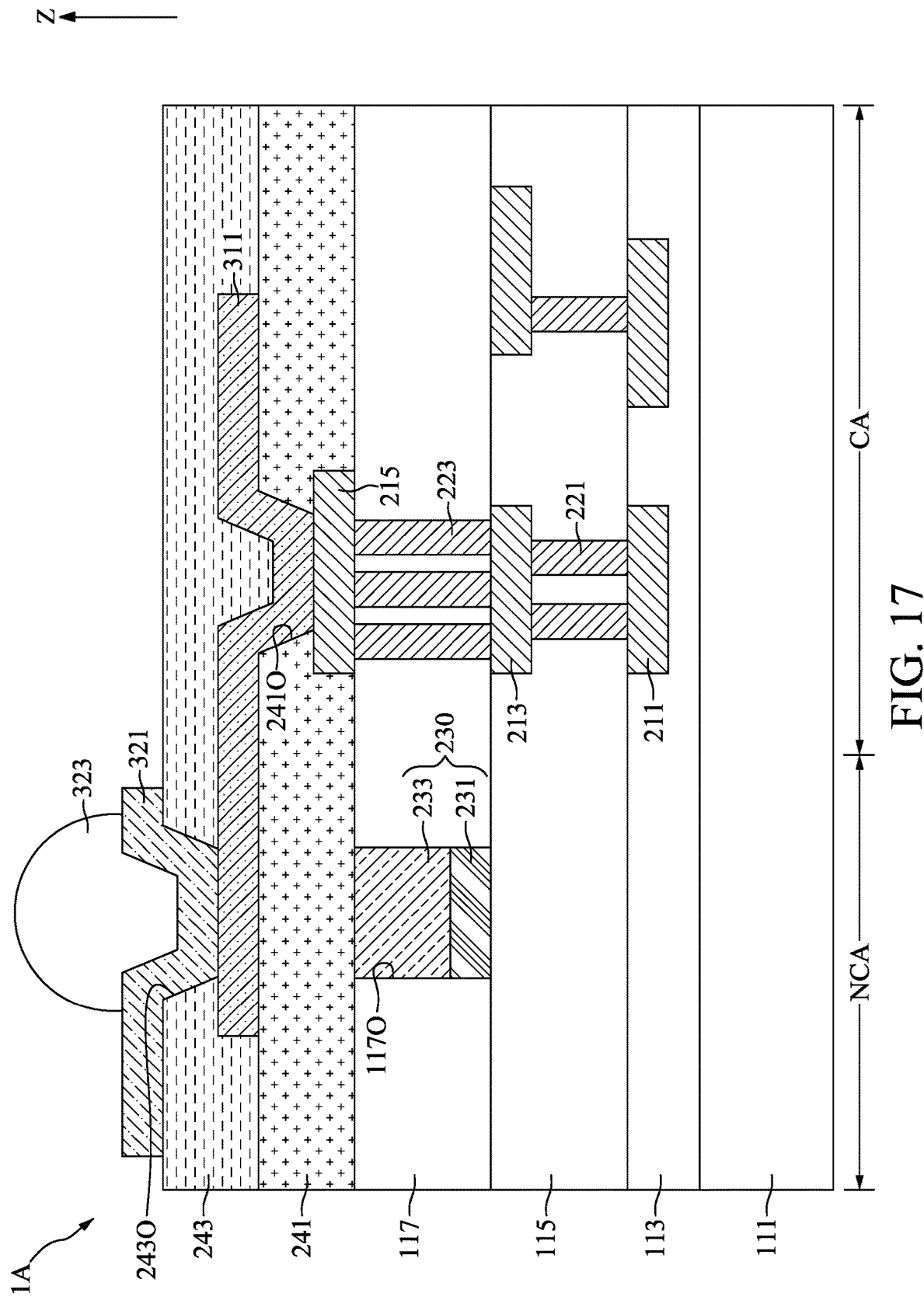

With reference to FIG. 17, the external connector 323 may be formed on the connector barrier layer 321 and above the connector barrier layer 321. In some embodiments, the external connector 323 may be utilized for electrically connecting to an external semiconductor chip or another semiconductor chip. In some embodiments, the external connector 323 may be part of a ball grid array and may include a material such as tin, or other suitable materials, such as silver, lead-free tin, or copper. In some embodiments, the external connector 323 may be a tin solder bump, the external connector 323 may be formed by initially forming a layer of tin through evaporation, electroplating, printing, solder transfer, ball placement, etc., to a thickness of, e.g., about 100 μm. Once a layer of tin has been formed on the surface, a reflow may be performed in order to shape the material into the desired bump shape.

During a process of forming the external connector 323 (or a wiring process), a stress may be applied to semiconductor device 1A and the stress may cause delamination of the semiconductor device 1A. To reduce the effect of the stress, the cushion structure 230 directly below the external connector 323 may serve as a cushion to reduce the stress and prevent layers from delaminating. In addition, the top passivation layer 243 formed of polymeric material may be capable of absorbing and distributing the stress to further improve the stress-buffering capability of the semiconductor device 1A.

FIGS. 18 to 23 illustrate, in schematic cross-sectional view diagrams, a flow for fabricating the semiconductor device 1B in accordance with another embodiment of the present disclosure.

Figure 18:
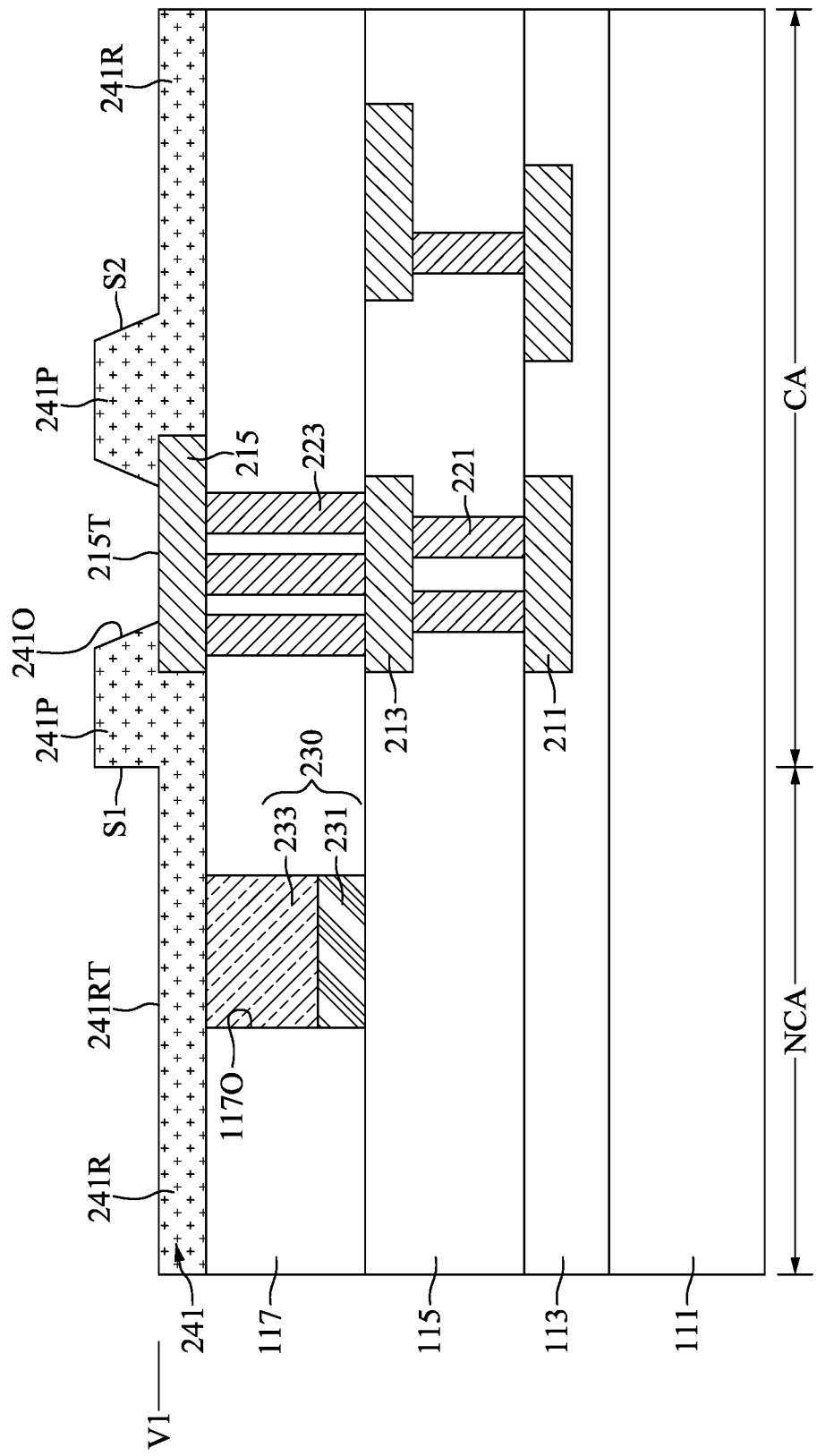
FIGS. 18 to 23 illustrate, in schematic cross-sectional view diagrams, a flow for fabricating the semiconductor device in accordance with another embodiment of the present disclosure.
Figure 19:
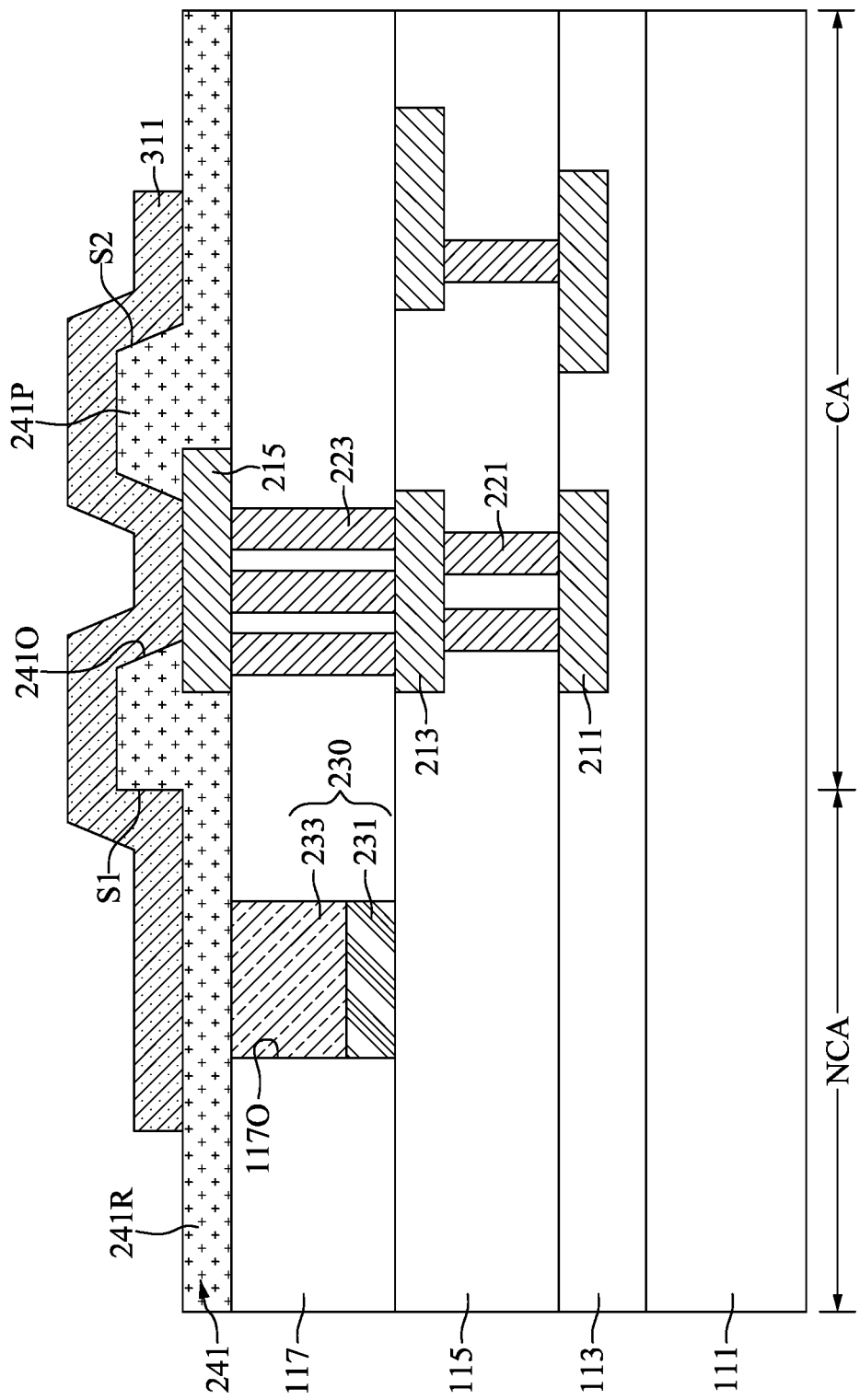
Figure 20:
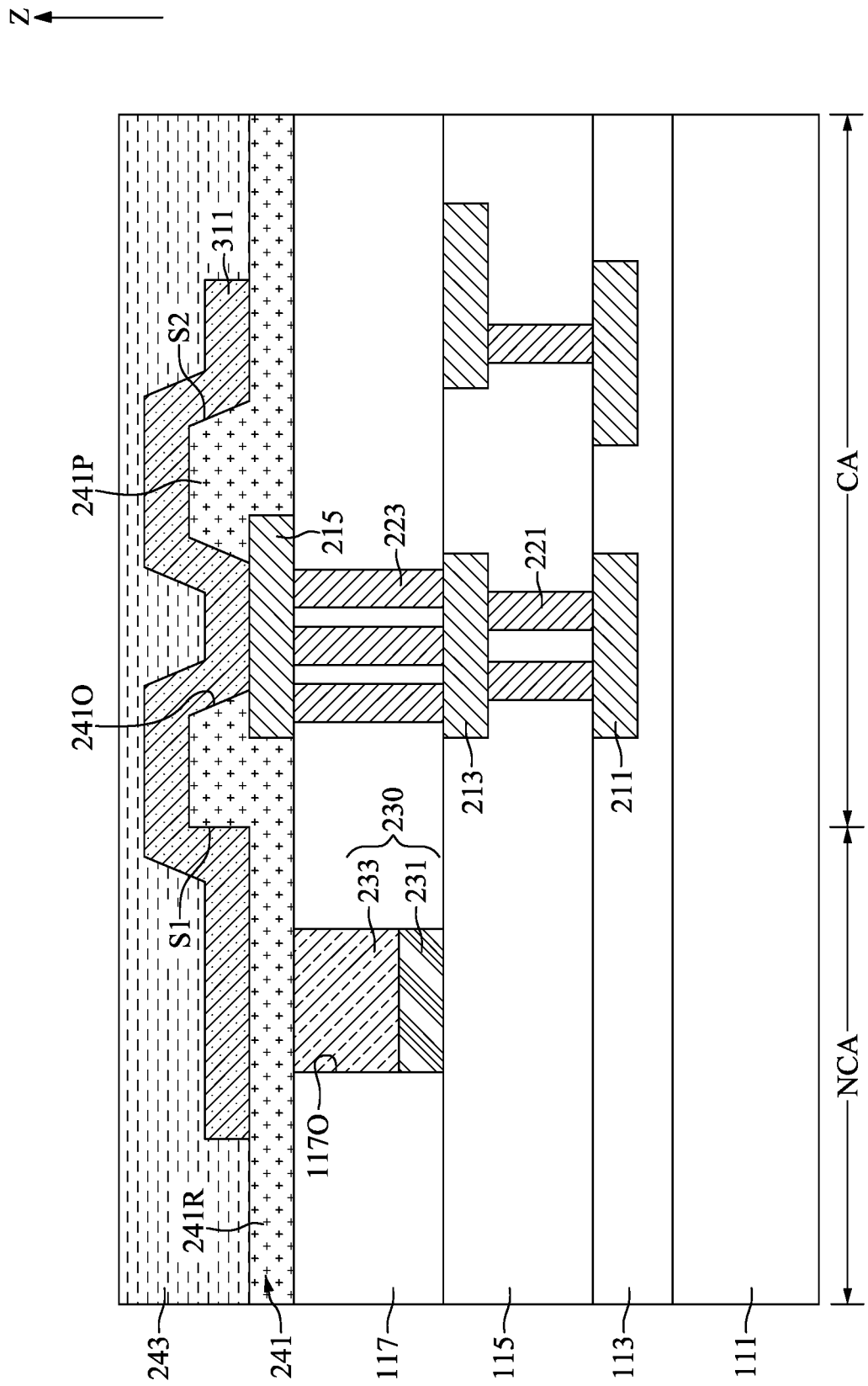
Figure 21:
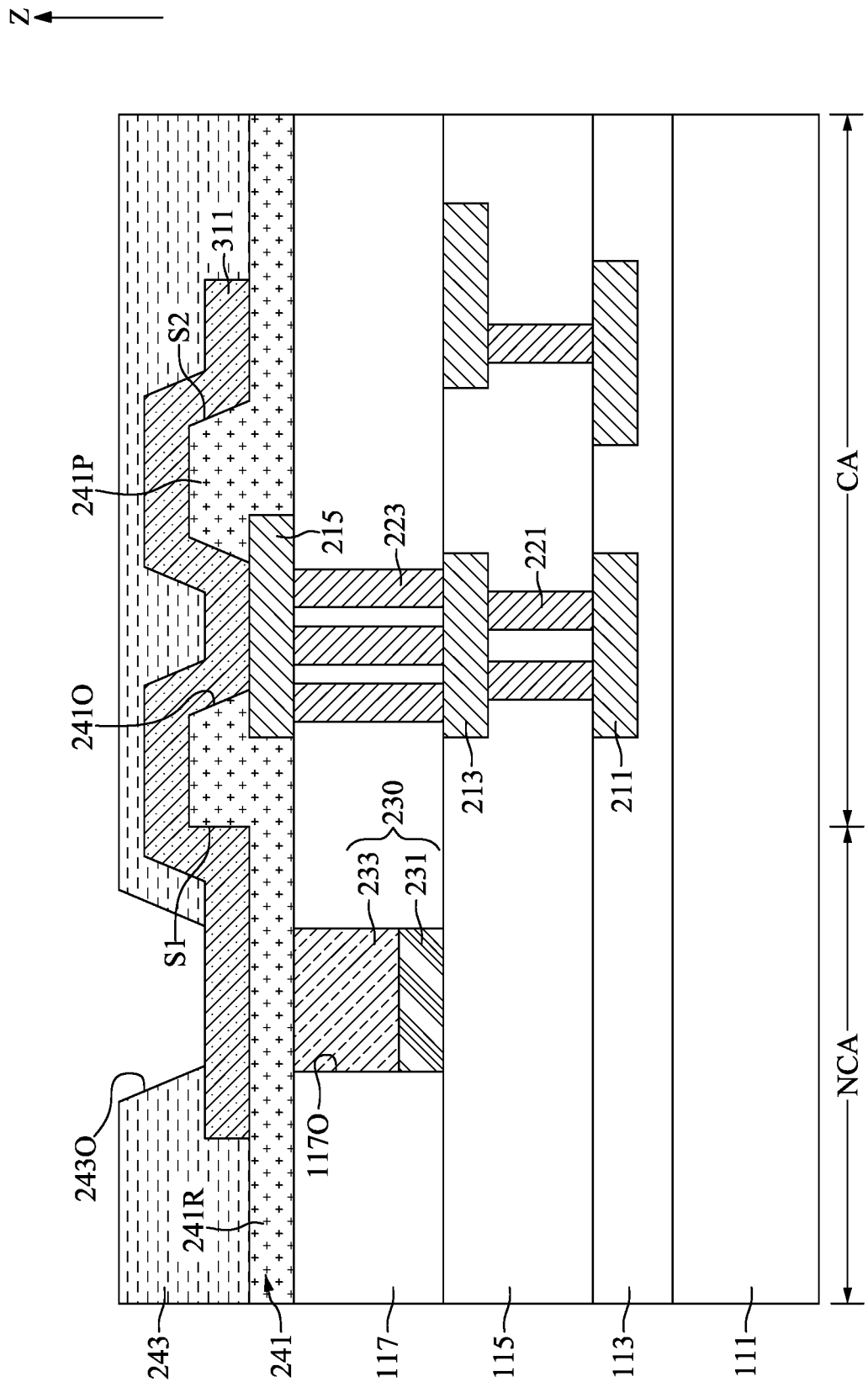
Figure 22:
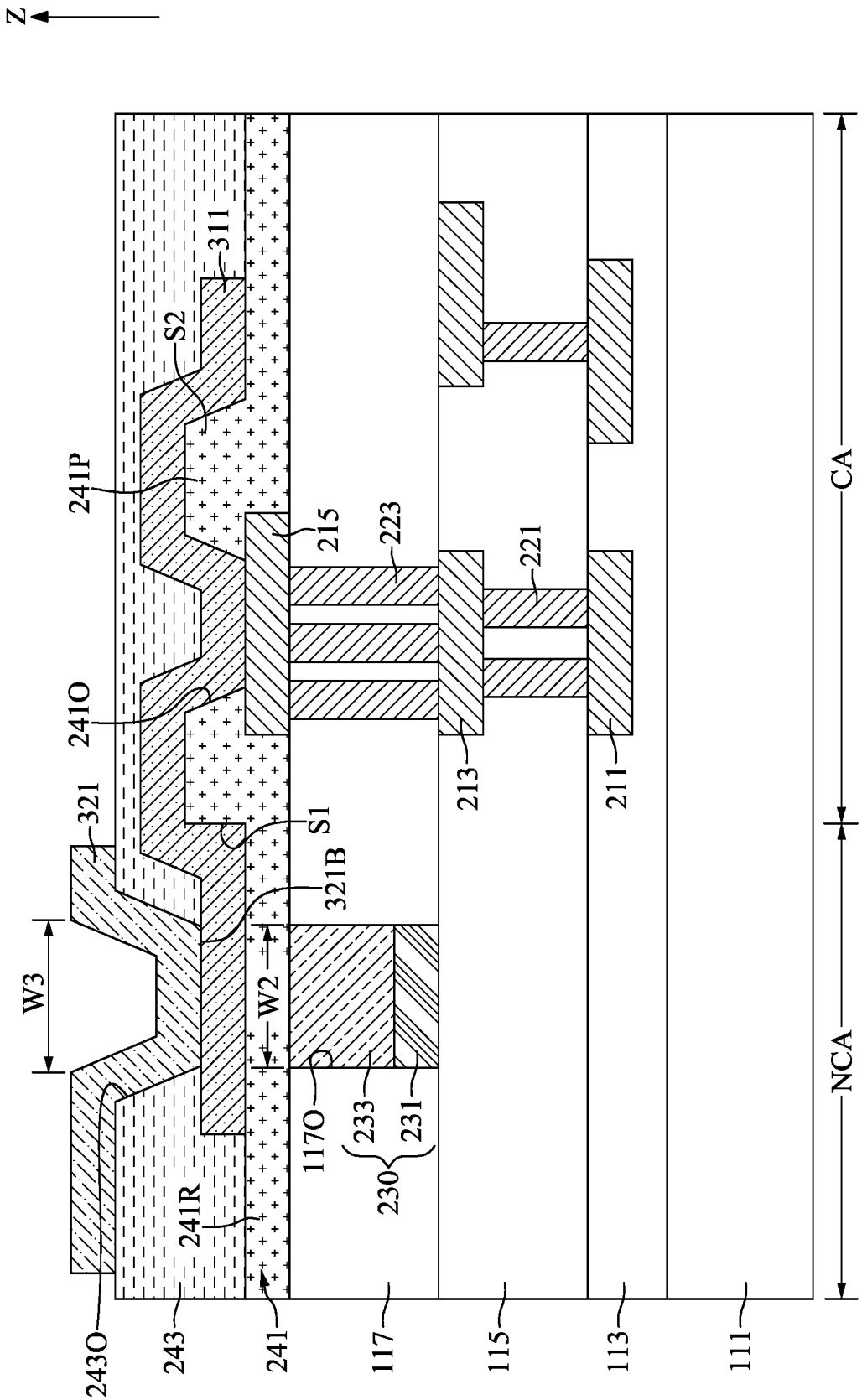
Figure 23:
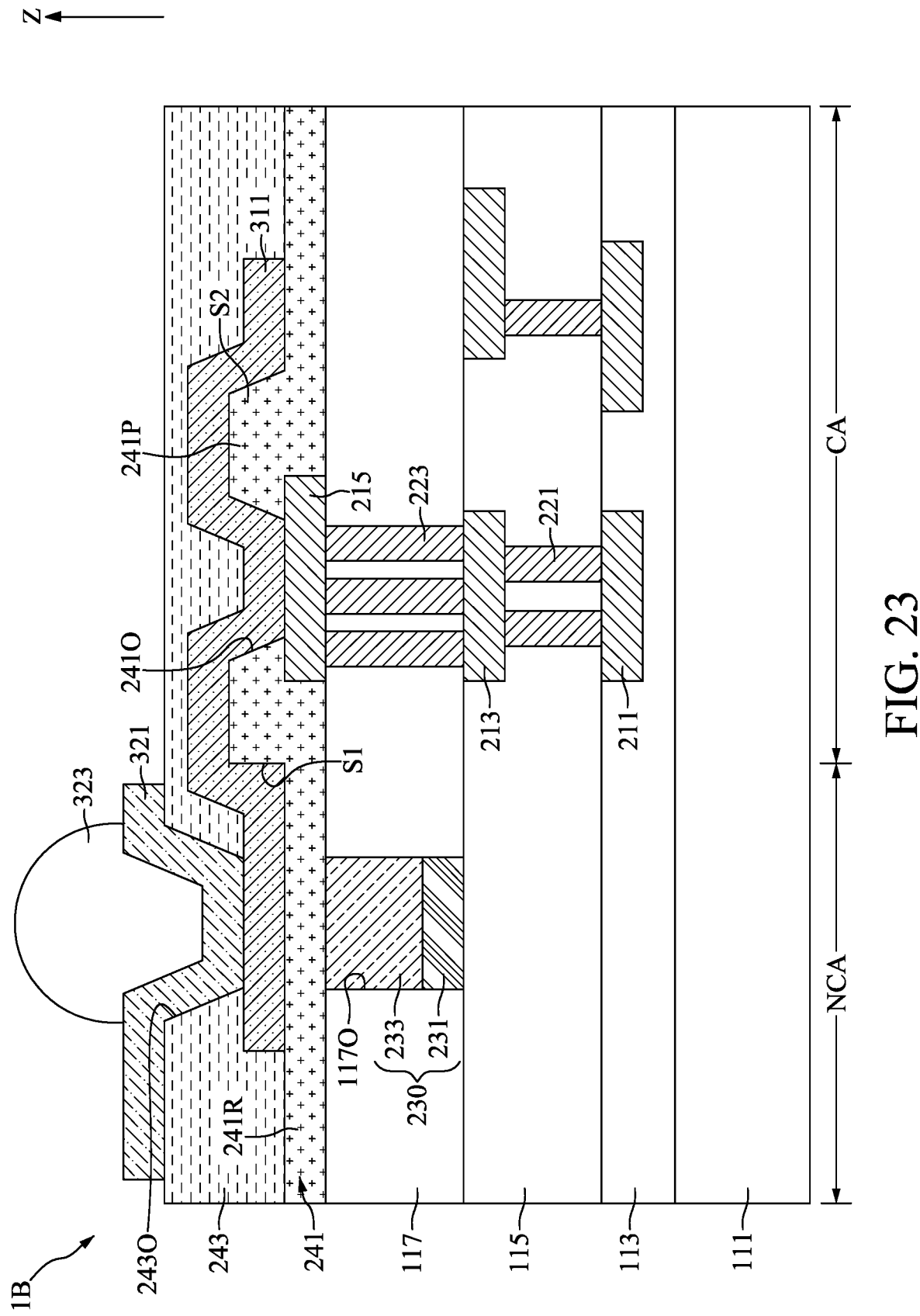

With reference to FIG. 18, an intermediate semiconductor device may be fabricated with a procedure similar to that illustrated in FIGS. 2 to 11. Sequentially, the bottom passivation layer 241 may be patterned to form the bottom passivation layer 241 including a recessing portion 241R and a plurality of protruding portions 241P.

With reference to FIG. 18, in some embodiments, the recessing portion 241R may be formed on the top dielectric layer 117 and surround the top conductive pad 215. The recessing portion 241R may cover the circuit area CA and the non-circuit area NCA in a top-view perspective (not shown). In some embodiments, the top surface 241RT of the recessing portion 241R and the top surface 215T of the top conductive pad 215 may be at the same vertical level V1. In some embodiments, the top surface 241RT of the recessing portion 241R and the top surface 215T of the top conductive pad 215 may be at different vertical levels. For example, the top surface 241RT of the recessing portion 241R may be at a vertical level lower than the top surface 215T of the top conductive pad 215.

With reference to FIG. 18, in some embodiments, the plurality of protruding portions 241P may be formed on the recessing portion 241R and cover a portion of the top conductive pad 215. The plurality of protruding portions 241P may surround a space which exposes the top surface 215T of the top conductive pad 215. The space exposing the top conductive pad 215 may be referred to as the opening 241O. A first step S1 and a second step S2 may be formed opposite to the opening 241O and adjacent to the interfaces between the recessing portion 241R and the plurality of protruding portions 241P, respectively and correspondingly. In some embodiments, the first step S1 may be located at the border between the circuit area CA and the non-circuit area NCA but is not limited thereto. In some embodiments, the second step S2 may be located above the circuit area CA.

The bottom passivation layer 241 configured with different portions results in a varied thickness profile of the bottom passivation layer 241 along the direction perpendicular to the direction Z. pressure to the semiconductor device 1B may be adjusted by the varied thickness profile so as to reduce the warpage of the semiconductor device 1B.

With reference to FIGS. 19 to 23, the redistribution layer 311, the top passivation layer 243, the openings 243O, the connector barrier layer 321, and the external connector 323 may be formed with a procedure similar to that illustrated in FIGS. 13 to 17, and descriptions thereof are not repeated herein.

One aspect of the present disclosure provides a semiconductor device including a substrate including a circuit area and a non-circuit area; a top dielectric layer positioned on the substrate; a top interconnector positioned along top dielectric layer and above the circuit area; a cushion structure positioned along the top dielectric layer and above the non-circuit area; a bottom passivation layer positioned on the top dielectric layer; a top conductive pad positioned in the bottom passivation layer and on the top interconnector; a redistribution layer positioned on the top conductive pad, on the bottom passivation layer, and extending from the circuit area to the non-circuit area; and an external connector positioned on the redistribution layer and above the cushion structure. The cushion structure includes a porous polymeric material.

Another aspect of the present disclosure provides a semiconductor device including a substrate including a circuit area and a non-circuit area; a top dielectric layer positioned on the substrate; a top interconnector positioned along top dielectric layer and above the circuit area; a cushion structure positioned along the top dielectric layer and above the non-circuit area; a top conductive pad positioned on the top interconnector; a bottom passivation layer including a recessing portion positioned on the top dielectric layer, surrounding the top conductive pad, and covering the cushion structure, and a plurality of protruding portions positioned on the recessing portion, covering a portion of the top conductive pad, and above the circuit area; a redistribution layer positioned on the top conductive pad, covering the plurality of protruding portions, and extending from the circuit area to the non-circuit area to cover a portion of the recessing portion; and an external connector positioned on the redistribution layer and above the cushion structure. The cushion structure includes a porous polymeric material.

Another aspect of the present disclosure provides a method for fabricating a semiconductor device including providing a substrate including a circuit area and a non-circuit area; forming a top dielectric layer on the substrate; forming a top interconnector along the top dielectric layer and above the circuit area; forming a cushion structure along the top dielectric layer and above the non-circuit area; forming a top conductive pad on the top interconnector; forming a bottom passivation layer on the top dielectric layer to surround the top conductive pad and cover the cushion structure; forming a redistribution layer on the top conductive pad, on the bottom passivation layer, and extending from the circuit area to the non-circuit area; and forming an external connector on the redistribution layer and above the cushion structure. The cushion structure includes a porous polymeric material.

Due to the design of the semiconductor device of the present disclosure, the cushion structure 230 may reduce the stress during a process of forming the external connector 323. As a result, the delamination of the semiconductor device 1A may be reduced. In addition, the top passivation layer 243 formed of polymeric material may be capable of absorbing and distributing the stress to further improve the stress-buffering capability of the semiconductor device 1A.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:
1. A semiconductor device, comprising:
a substrate comprising a circuit area and a non-circuit area next to the circuit area, wherein the circuit area and the non-circuit area are side-by-side to each other;
a top dielectric layer positioned on the substrate;
a top interconnector positioned along the top dielectric layer and above the circuit area;
a cushion structure positioned along the top dielectric layer and above the non-circuit area;
a top conductive pad positioned on the top interconnector;
a bottom passivation layer comprising:
a recessing portion positioned on the top dielectric layer, surrounding the top conductive pad, and covering the cushion structure; and
a plurality of protruding portions positioned on the recessing portion, covering a portion of the top conductive pad, and above the circuit area;
a redistribution layer positioned on the top conductive pad, covering the plurality of protruding portions, and extending from the circuit area to the non-circuit area to cover a portion of the recessing portion; and
an external connector positioned on the redistribution layer and above the cushion structure; wherein the cushion structure comprises a porous polymeric material, wherein the cushion structure is made of an energy-removable material and is positioned directly below the external connector for providing a cushion effect for the external connector;
wherein the top interconnector comprises:
a filler layer positioned along the top dielectric layer and electrically coupling to the top conductive pad;
an isolation layer positioned between the filler layer and the top dielectric layer; and
a barrier layer positioned between the filler layer and the isolation layer;
wherein the top interconnector comprises an adhesive layer positioned between the filler layer and the barrier layer;
wherein the top interconnector comprises a seed layer positioned between the filler layer and the adhesive layer;
wherein a top surface of the recessing portion and a top surface of the top conductive pad are at the same vertical level, such that a bottom surface of the redistribution layer is at the same vertical level of the top surface of the recessing portion.

2. The semiconductor device of claim 1, further comprising a connector barrier layer positioned between the external connector and the redistribution layer, wherein the connector barrier layer has a bottom surface in contact with the redistribution layer.

3. The semiconductor device of claim 2, wherein a width of the bottom surface of the connector barrier layer contacting with the redistribution layer and a width of the cushion structure are the same.

4. The semiconductor device of claim 3, wherein the top dielectric layer and the bottom passivation layer comprise the same material.

5. The semiconductor device of claim 4, further comprising a top passivation layer positioned on the bottom passivation layer, wherein the top passivation layer has a top passivation layer opening formed on a top surface thereof to expose a portion of the redistribution layer, wherein the connector barrier layer is extended from the top surface of the top passivation layer into the top passivation layer opening in order for the bottom surface of the connector barrier layer in contact with the redistribution layer.

6. The semiconductor device of claim 5, wherein the top passivation layer comprises a polymeric material.

7. The semiconductor device of claim 6, wherein the cushion structure comprises:
- a bottom cushion layer positioned in the top dielectric layer and comprising the porous polymeric material; and
- a top cushion layer positioned on the bottom cushion layer, wherein a thickness of the top dielectric layer is equal to a sum of a thickness of the top cushion layer and a thickness of the bottom cushion layer.

8. The semiconductor device of claim 1, wherein the top cushion layer comprises methylsilsesquioxane.

9. The semiconductor device of claim 8, wherein a ratio between a thickness of the bottom cushion layer to a thickness of the top cushion layer is between 0.1 and 1.5.

* * * * *